(12) United States Patent
Denta

(10) Patent No.: US 12,557,652 B2
(45) Date of Patent: Feb. 17, 2026

(54) SEMICONDUCTOR MODULE

(71) Applicant: FUJI ELECTRIC CO., LTD., Kawasaki (JP)

(72) Inventor: Toshio Denta, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 522 days.

(21) Appl. No.: 17/897,829

(22) Filed: Aug. 29, 2022

(65) Prior Publication Data

US 2023/0109985 A1   Apr. 13, 2023

(30) Foreign Application Priority Data

Oct. 12, 2021   (JP) ................. 2021-167147

(51) Int. Cl.
*H01L 23/40* (2006.01)
*H01L 23/00* (2006.01)
(Continued)

(52) U.S. Cl.
CPC .......... *H01L 23/4006* (2013.01); *H01L 25/16* (2013.01); *H01L 23/3121* (2013.01); *H01L 2023/4068* (2013.01); *H01L 2023/4081* (2013.01); *H01L 2023/4087* (2013.01); *H01L 23/49575* (2013.01); *H01L 24/45* (2013.01);
(Continued)

(58) Field of Classification Search
None
See application file for complete search history.

(56) References Cited

U.S. PATENT DOCUMENTS 4,460,917 A * 7/1984 Rogers .................... H01L 23/32
257/796
4,878,108 A * 10/1989 Phelps, Jr. .......... H01L 23/4006
257/713

(Continued)

FOREIGN PATENT DOCUMENTS

JP   S62043156 A   2/1987
JP   2006-093255 A   4/2006
(Continued)

OTHER PUBLICATIONS

Japanese Patent Office Action issued on Jun. 17, 2025 for corresponding JP Patent Application No. 2021-167147.

*Primary Examiner* — Nishath Yasmeen
(74) *Attorney, Agent, or Firm* — Rabin & Berdo, P.C.

(57) ABSTRACT

A semiconductor module, including a semiconductor chip, a sealed main body portion sealing the semiconductor chip and having a pair of attachment holes penetrating therethrough, a heat dissipation plate in contact with the sealed main body portion. The heat dissipation plate is positioned between the attachment holes in a plan view of the semiconductor module. The semiconductor module further includes a pair of rear surface supporting portions and/or a pair of front surface supporting portions protruding respectively from rear and front surfaces of the sealed main body portion. In the plan view, the heat dissipation plate is formed between the pair of attachment holes, which are in turn between the pair of rear surface supporting portions. The pair of front surface supporting portions are formed substantially between the pair of attachment holes in the plan view.

17 Claims, 17 Drawing Sheets

(51) Int. Cl.
   *H01L 23/31*     (2006.01)
   *H01L 23/495*    (2006.01)
   *H01L 25/16*     (2023.01)

(52) U.S. Cl.
   CPC .............. *H01L 24/48* (2013.01); *H01L 24/49* (2013.01); *H01L 2224/45124* (2013.01); *H01L 2224/45139* (2013.01); *H01L 2224/45144* (2013.01); *H01L 2224/45147* (2013.01); *H01L 2224/48105* (2013.01); *H01L 2224/48137* (2013.01); *H01L 2224/48245* (2013.01); *H01L 2224/4903* (2013.01)

(56) References Cited

U.S. PATENT DOCUMENTS

| | | | | |
|---|---|---|---|---|
| 5,793,106 A * | 8/1998 | Yasukawa | ........... | H01L 23/3121 257/713 |
| 6,122,170 A * | 9/2000 | Hirose | .................. | C04B 37/026 174/16.3 |
| 7,589,970 B2 * | 9/2009 | Hsieh | .................. | H01L 23/4006 361/709 |
| 8,258,622 B2 * | 9/2012 | Lee | ....................... | H01L 21/565 257/726 |
| 8,363,409 B2 * | 1/2013 | Chung | ................ | H01L 23/4006 361/728 |
| 9,521,737 B2 * | 12/2016 | Izuo | ..................... | H05K 7/2039 |
| 9,711,430 B2 * | 7/2017 | Nishida | .................... | H01L 21/56 |
| 10,050,007 B2 * | 8/2018 | Bando | ................... | H01L 25/072 |
| 10,652,995 B2 * | 5/2020 | Robin | .................. | H05K 3/0061 |
| 11,211,304 B2 * | 12/2021 | Otremba | .............. | H01L 23/4006 |
| 11,676,881 B2 * | 6/2023 | Otremba | .............. | H01L 23/3677 257/712 |
| 2006/0060982 A1 | 3/2006 | Ikawa et al. | | |
| 2008/0080140 A1 * | 4/2008 | Hsieh | .................. | H01L 23/4006 257/E23.084 |
| 2010/0091464 A1 * | 4/2010 | Ohnishi | ................. | H05K 7/209 29/890.03 |
| 2015/0289356 A1 * | 10/2015 | Izuo | ........................ | H01L 23/10 361/709 |
| 2017/0330818 A1 * | 11/2017 | Yamagishi | ............... | H01L 23/40 |
| 2019/0006258 A1 * | 1/2019 | Muto | ................... | H01L 23/4006 |
| 2019/0252292 A1 * | 8/2019 | Nagahara | ............. | H05K 7/2089 |
| 2021/0020539 A1 * | 1/2021 | Otremba | .............. | H01L 23/3107 |

FOREIGN PATENT DOCUMENTS

| | | |
|---|---|---|
| JP | 2019161129 A | 9/2019 |
| JP | 2020205337 A | 12/2020 |
| WO | 2019/239997 A1 | 12/2019 |

\* cited by examiner

SEMICONDUCTOR MODULE

CROSS-REFERENCE TO RELATED APPLICATION

This application is based upon and claims the benefit of priority of the prior Japanese Patent Application No. 2021-167147, filed on Oct. 12, 2021, the entire contents of which are incorporated herein by reference.

BACKGROUND OF THE INVENTION

1. Field of the Invention

The embodiments discussed herein relate to a semiconductor module.

2. Background of the Related Art

A semiconductor device includes a semiconductor module including semiconductor chips and a heat dissipation plate attached The to the semiconductor module. semiconductor chips include, as power devices, switching elements and diode elements. The switching elements are, for example, insulated gate bipolar transistors (IGBTs) or power MOSFETS (metal-oxide-semiconductor field-effect transistors). The diode elements are freewheeling diodes (FWDs) such as Schottky barrier diodes (SMDs) or P-intrinsic-N (PiN) diodes. A control IC controls driving of these switching elements. Such a semiconductor module as described above is attached to a heat dissipation plate by using screws (for example, see International Publication Pamphlet No. 2019/239997).

In the case of the above semiconductor device, when the semiconductor module is attached to the heat dissipation plate with screws, the semiconductor module could be damaged. For example, when the semiconductor module has screw holes on its two sides in its longitudinal direction in plan view, one side of the semiconductor module is first screwed to the heat dissipation plate (a cooling board), and the other side is next screwed to the heat dissipation plate. If one side is screwed first, the other side of the semiconductor module could be lifted. If the lifted other side is next screwed without proper care, large stress is applied to the center portion of the semiconductor module. As a result, for example, the case of the semiconductor module could be cracked, and a crack could occur in an inner board of the semiconductor module.

SUMMARY OF THE INVENTION

In one aspect of the embodiments, there is provided a semiconductor module including: a semiconductor chip; a sealed main body portion sealing the semiconductor chip with a sealing material, the sealed main body portion being of a cuboid shape, and having a pair of attachment holes penetrating therethrough from a front surface thereof to a rear surface thereof; a heat dissipation plate, a main surface of which is in contact with the rear surface of the sealed main body portion, the heat dissipation plate being positioned between the pair of attachment holes in a plan view of the semiconductor module; and a pair of rear surface supporting portions protruding from the rear surface of the sealed main body portion, and corresponding respectively to the pair of attachment holes, both the heat dissipation plate and the pair of attachment holes being positioned between the pair of rear surface supporting portions in the plan view of the semiconductor module, and/or a pair of front surface supporting portions protruding from the front surface of the sealed main body portion, and corresponding respectively to the pair of attachment holes, the front surface supporting portions being formed substantially between the pair of attachment holes in the plan view of the semiconductor module.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. In the following description, regarding a semiconductor device 1 in the following drawings, terms "front surface" and "top surface" each mean an upward surface. Likewise, regarding the semiconductor device 1 in the following drawings, a term "up" means an upward direction. In addition, regarding the semiconductor device 1 in the following drawings, terms "rear surface" and "bottom surface" each mean a downward surface. Likewise, regarding the semiconductor device 1 in the following drawings, a term "down" means a downward direction. In the other drawings, too, the above terms mean their respective directions, as needed. The terms "front surface", "top surface", "up", "rear surface", "bottom surface", "down", and "side surface" are only expressions used for the purpose of convenience to determine relative positional relationships and do not limit the technical concept of the embodiments. For example, the terms "up" and "down" may mean directions other than the vertical directions with respect to the ground. That is, the directions expressed by "up" and "down" are not limited to the directions relating to the gravitational force. In the following description, when a component contained in material represents 80 vol % or more of the material, this component will be referred to as the "main component" of the material.

First Embodiment

Figure 1:
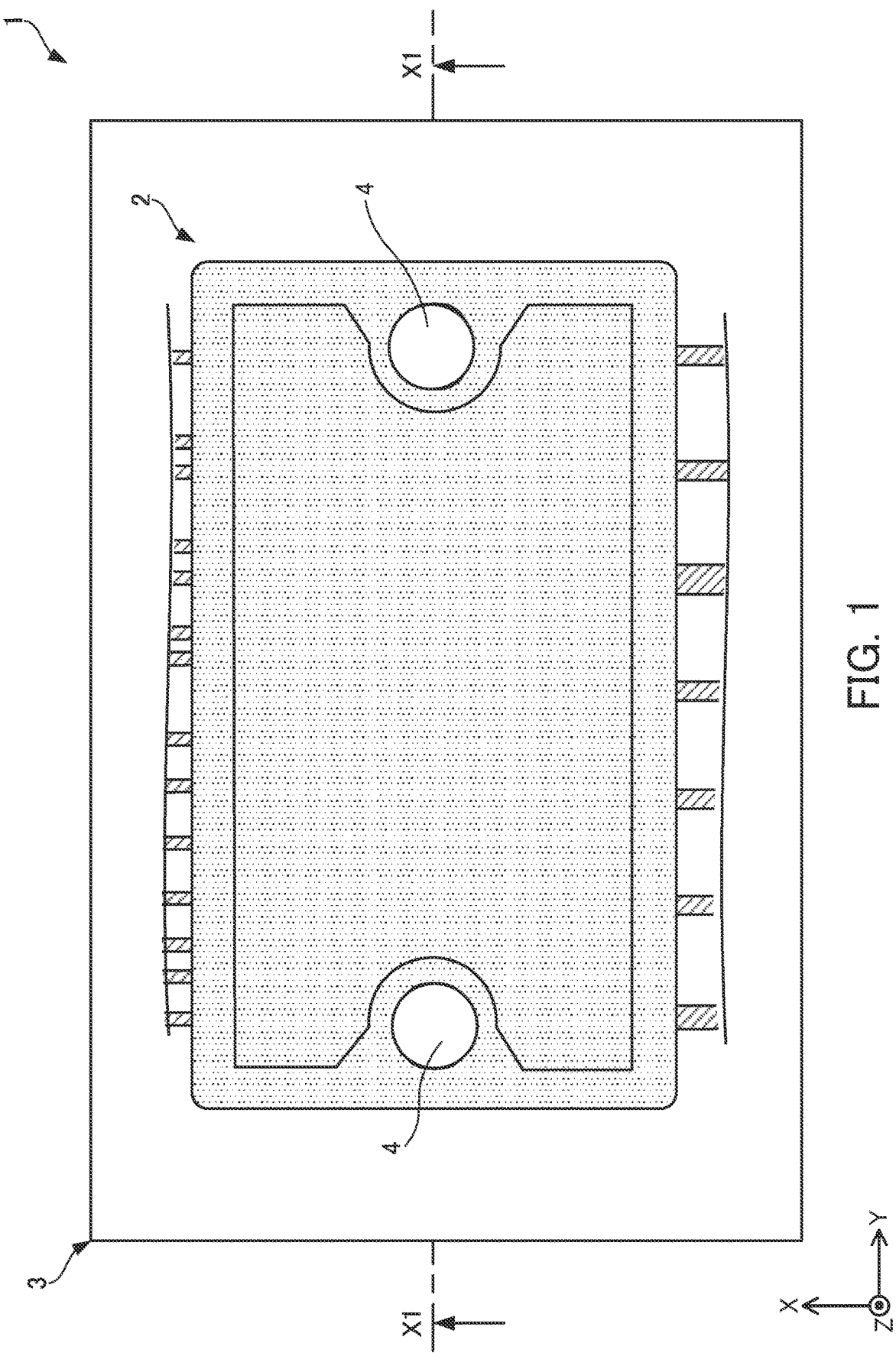
FIG. 1 is a plan view of a semiconductor device according to a first embodiment.
Figure 2:
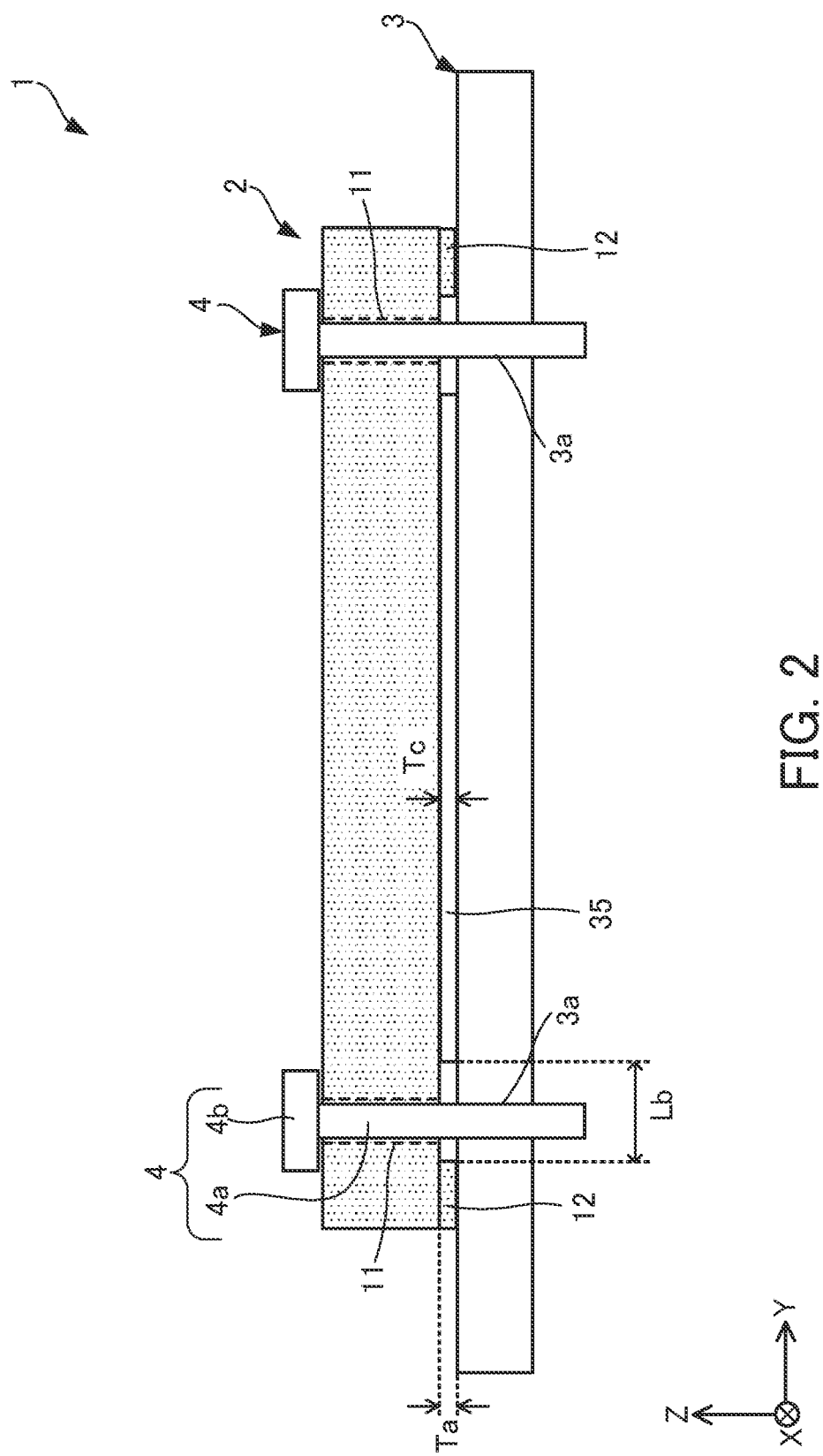
FIG. 2 is a transverse sectional view of the semiconductor device according to the first embodiment.

A semiconductor device 1 will be described with reference to FIGS. 1 and 2. FIG. 1 is a plan view of the semiconductor device according to the first embodiment. FIG. 2 is a transverse sectional view of the semiconductor device according to the first embodiment. FIG. 2 is a sectional view taken along a dashed-dotted line X1-X1 in FIG. 1.

The semiconductor device 1 includes a semiconductor module 2 and a cooling board 3. The semiconductor module 2 is fixed to the cooling board 3 with screws 4. The semiconductor module 2 has an approximately rectangular shape in plan view. Corner portions of the semiconductor module 2 may be chamfered or rounded. A heat dissipation plate 35 protrudes from the rear surface of the semiconductor module 2. The thickness of the heat dissipation plate 35 (the distance in the −Z direction) is Tc. The semiconductor module 2 has a pair of attachment holes 11. The pair of attachment holes 11 are formed in two end portions of the semiconductor module 2 in a longitudinal direction (±Y directions) of the semiconductor module 2 in plan view. Each of the attachment holes 11 is formed in a center portion of a corresponding one of the end portions in a lateral direction (±X directions). Each of the attachment holes 11 is formed closer to a corresponding short side of the semiconductor module 2 than the heat dissipation plate 35 in plan view. The individual attachment hole 11 penetrates through the semiconductor module 2 from the front surface to the rear surface of the semiconductor module 2.

Rear surface supporting portions 12 are formed on the rear surface of the semiconductor module 2. The rear surface supporting portions 12 are formed outside the attachment holes 11 in the longitudinal direction on the rear surface of the semiconductor module 2. The rear surface supporting portions 12 may be formed along their respective short sides on the rear surface of the semiconductor module 2. The rear surface supporting portions 12 each have a height Ta (the length in the Z direction). While the height Ta of the individual rear surface supporting portion 12 may be smaller than the thickness Tc of the heat dissipation plate 35, it is preferable that the height Ta be approximately equal to the thickness Tc. The thickness Tc is between 0.1 mm and 0.3 mm, inclusive. For example, the thickness Tc is 0.2 mm. In addition, a distance Lb between an end portion of a rear surface supporting portion 12 and an end portion of the heat dissipation plate 35 is larger than the diameter of the individual screw 4 (a shaft portion 4a) by approximately 1 mm. The semiconductor module 2 will be described in detail below.

The cooling board 3 has a substantially flat and smooth main surface. The semiconductor module 2 is mounted on this main surface. The semiconductor module 2 may be mounted on the main surface via thermal grease. The cooling board 3 has, for example, this main surface and has a flat plate shape. The shape of the cooling board 3 is not limited to a flat plate shape. That is, the cooling board 3 may have another shape, as long as the cooling board 3 has the above main surface. The cooling board 3 may have a plurality of fins on its rear surface. The cooling board 3 has fixing holes 3a. The fixing holes 3a are formed at locations corresponding to the attachment holes in 11 the semiconductor module 2 mounted on the main surface. The screws 4 are engaged with and fixed to the fixing holes 3a. The fixing holes 3a do not necessarily need to penetrate through the cooling board 3. The fixing holes 3a may have any shape, as long as the fixing holes 3a engage with the screws 4.

The cooling board 3 is made of metal material having excellent thermal conductivity as its main component. The metal material is, for example, copper, aluminum, or an alloy containing at least one of these kinds. The cooling board 3 has a thickness between 0.5 mm and 2.0 mm, inclusive. The entire cooling board 3 may be plated, to improve its corrosion resistance. The material used for this plating is, for example, nickel, a nickel-phosphorus alloy, or a nickel-boron alloy.

A cooling device may be attached to the rear surface of the cooling board 3 via solder, wax material, or thermal interface material. In this way, the heat dissipation of the cooling board 3 is improved. Refrigerant is caused to flow inside the cooling device for heat dissipation. The wax material contains at least one of an aluminum alloy, a titanium alloy, a magnesium alloy, a zirconium alloy, and a silicon alloy as its main component, for example. When wax material is used, the semiconductor module 2 may be bonded to an area on the front surface of the cooling board 3 by brazing. For example, the thermal interface material refers to a generic germ for various kinds of material such as thermally conductive grease, an elastomer sheet, room temperature vulcanization (RTV) rubber, gel, and phase change material. The grease is, for example, silicone in which metal-oxide filler is added.

Each of the screws 4 is formed by a shaft portion 4a and a head portion 4b. The shaft portion 4a has a cylindrical shape. The shaft portion 4a has at least threads at its tip portion, and these threads engage with a corresponding one of the fixing holes 3a. The diameter of the shaft portion 4a corresponds to the diameter of the corresponding attachment hole 11 and the diameter of the corresponding fixing hole 3a. The diameter of the attachment hole 11 and the diameter of the fixing hole 3a are larger than the diameter of the shaft portion 4a by approximately 1 mm, for example.

The head portion 4b is bonded integrally with one end portion of the shaft portion 4a. The one end portion of the shaft portion 4a is an end portion opposite to the tip portion of the cylindrical shaft portion 4a. The surface of the head portion 4b, the surface being bonded to the one end portion of the shaft portion 4a, is a substantially flat and smooth main surface. The head portion 4b may have a rectangular, semicircular, or trapezoidal shape in side view. The diameter of the head portion 4b is larger than the diameter of the shaft portion 4a. For example, the diameter of the head portion 4b is two to four times the diameter of the shaft portion 4a.

These screws 4 are made of material having high strength, such as steel, stainless steel, brass, aluminum, magnesium, plastic, or titanium, for example.

The screws 4 are inserted into their respective attachment holes 11 in the semiconductor module 2 and are engaged with their respective fixing holes 3a in the cooling board 3. When the screws 4 are engaged with the fixing holes 3a, the head portions 4b of the screws 4 press the peripheral areas of the attachment holes 11 on the front surface of the semiconductor module 2 toward the cooling board 3. In addition, the rear surface supporting portions 12 of the semiconductor module 2 and the heat dissipation plate 35 are pressed against the front surface of the cooling board 3.

Figure 3:
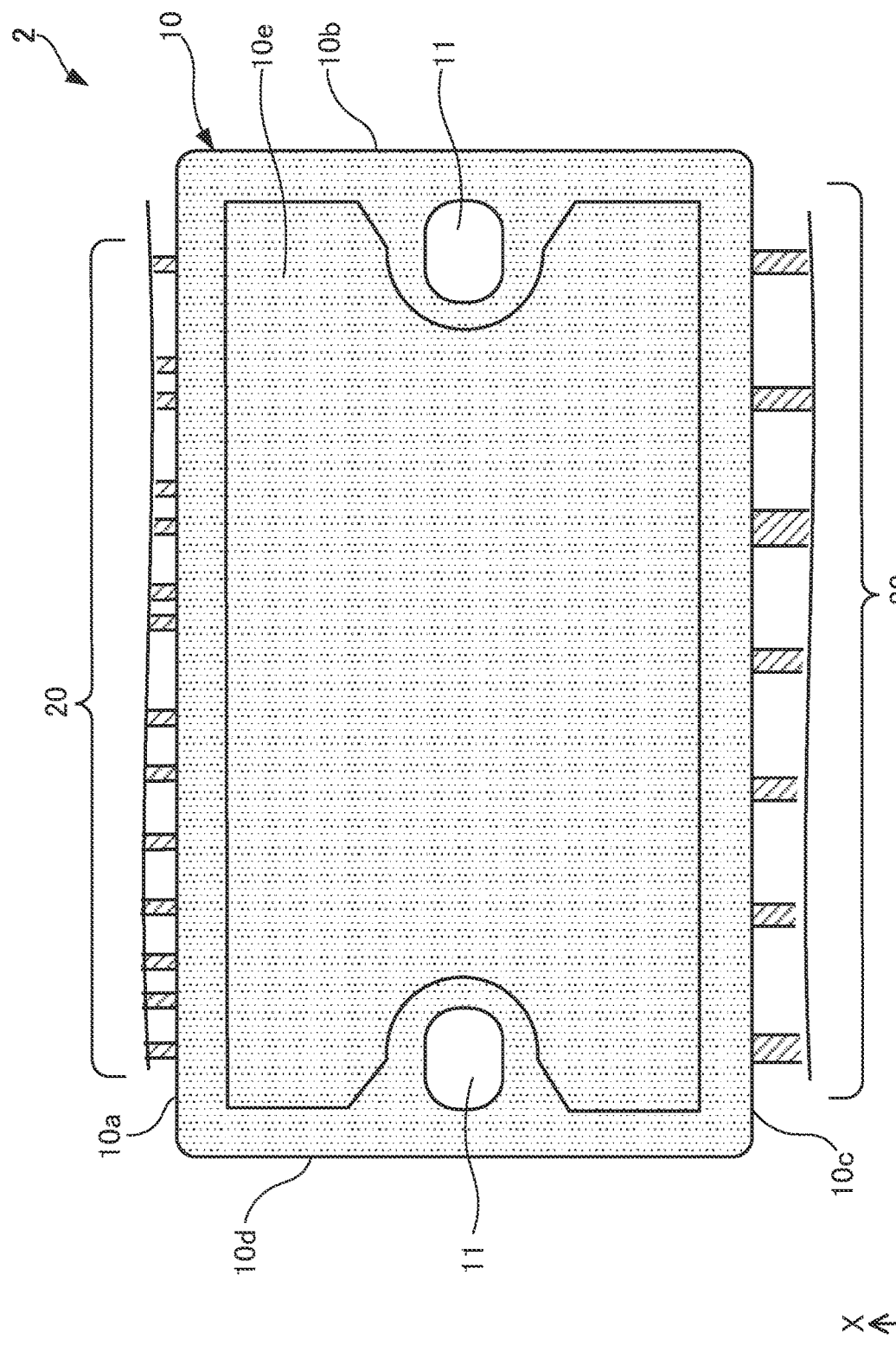
FIG. 3 is a plan view of a semiconductor module according to the first embodiment.
Figure 4:
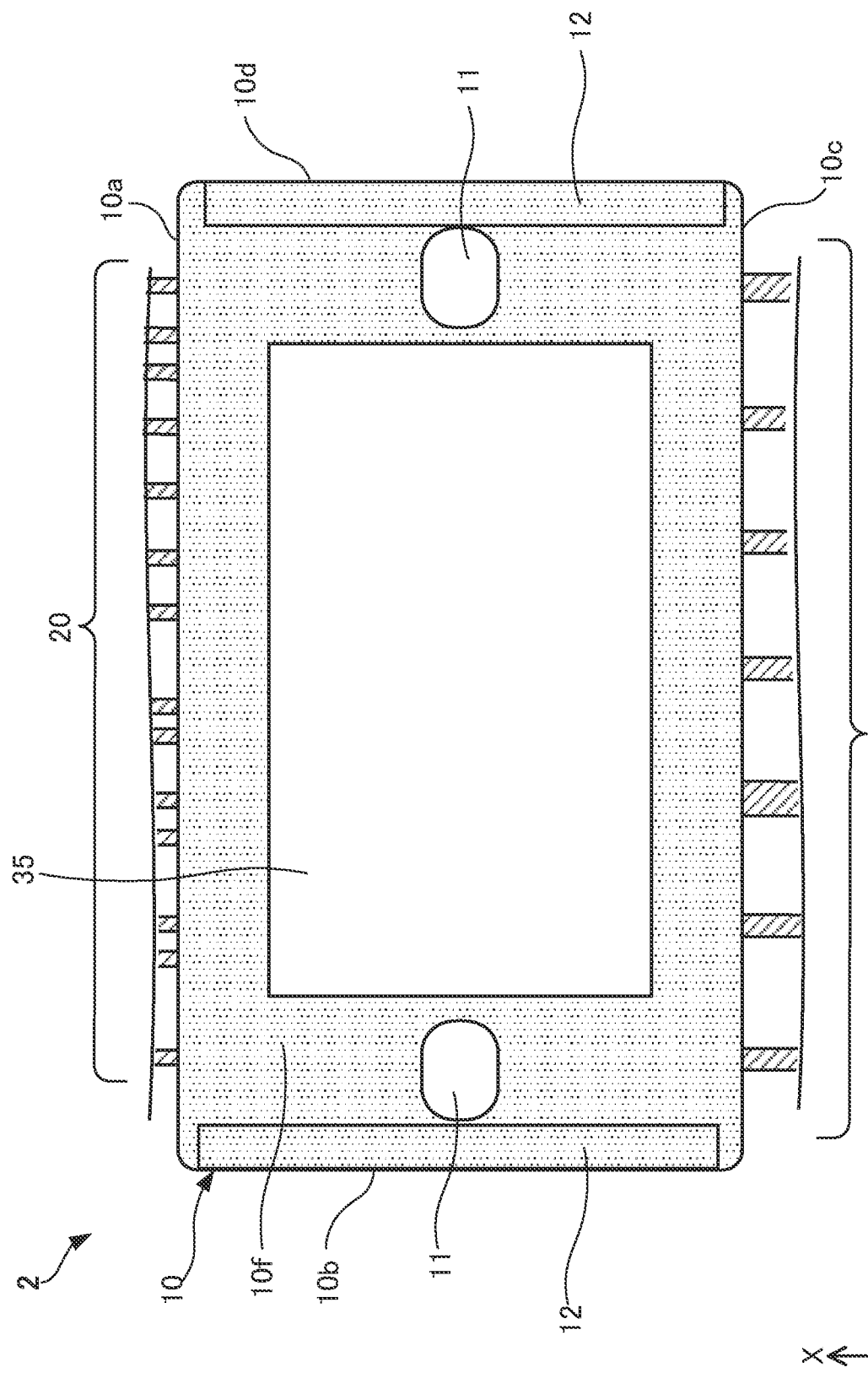
FIG. 4 is a bottom view of the semiconductor module according to the first embodiment.
Figure 5A:
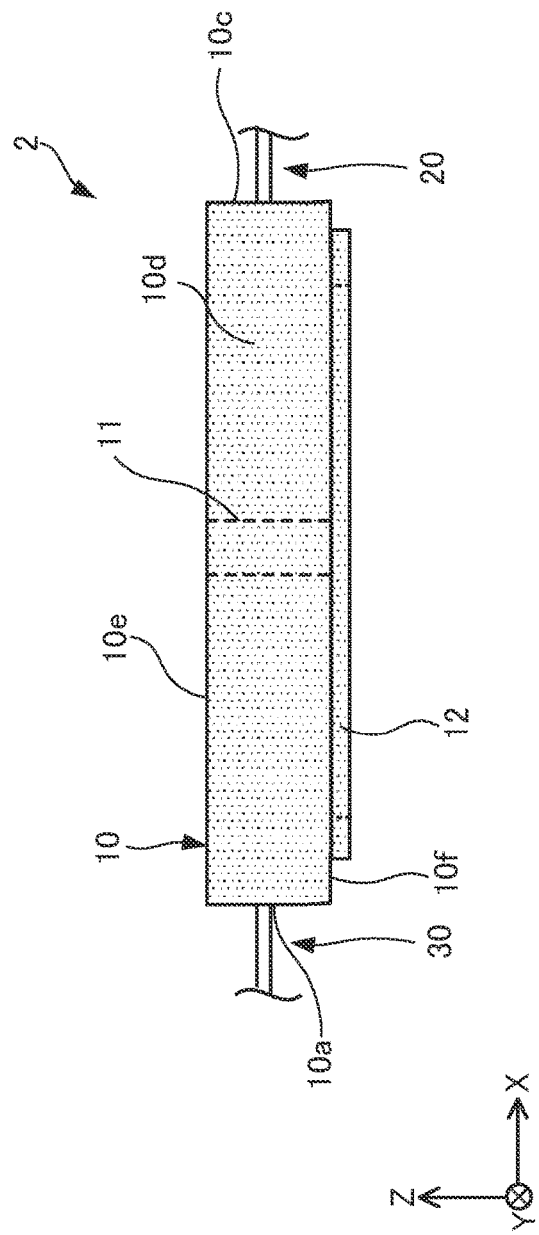
FIGS. 5A and 5B are each a side view of the semiconductor module according to the first embodiment.
Figure 5B:
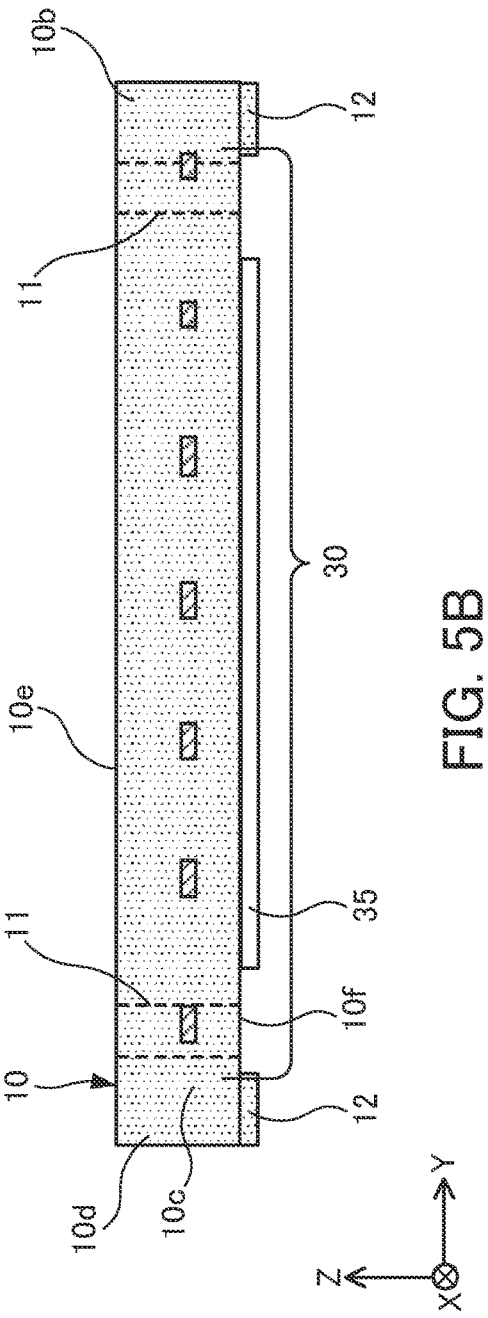
Figure 6:
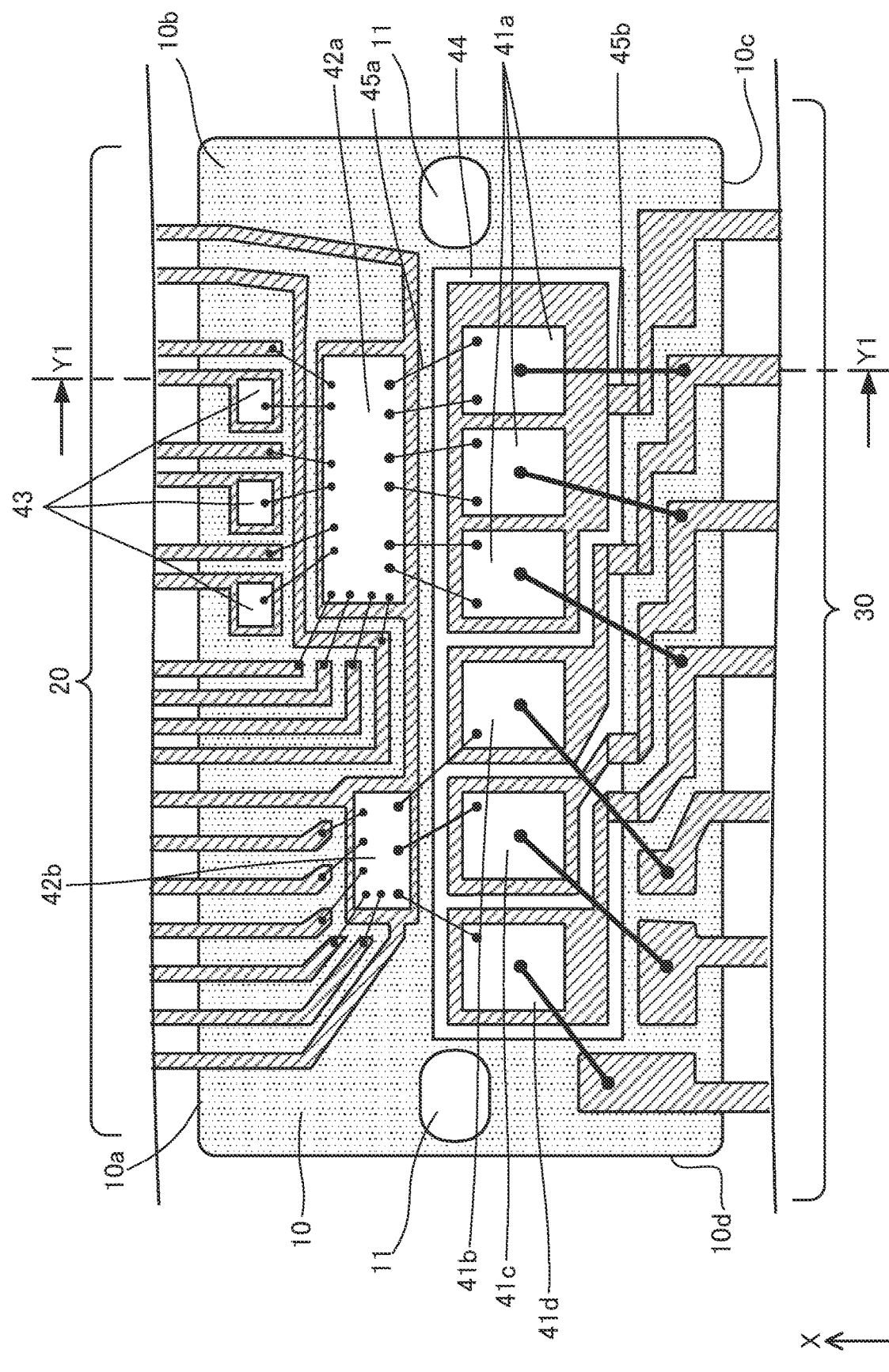
FIG. 6 is a longitudinal sectional view of the semiconductor module according to the first embodiment.
Figure 7:
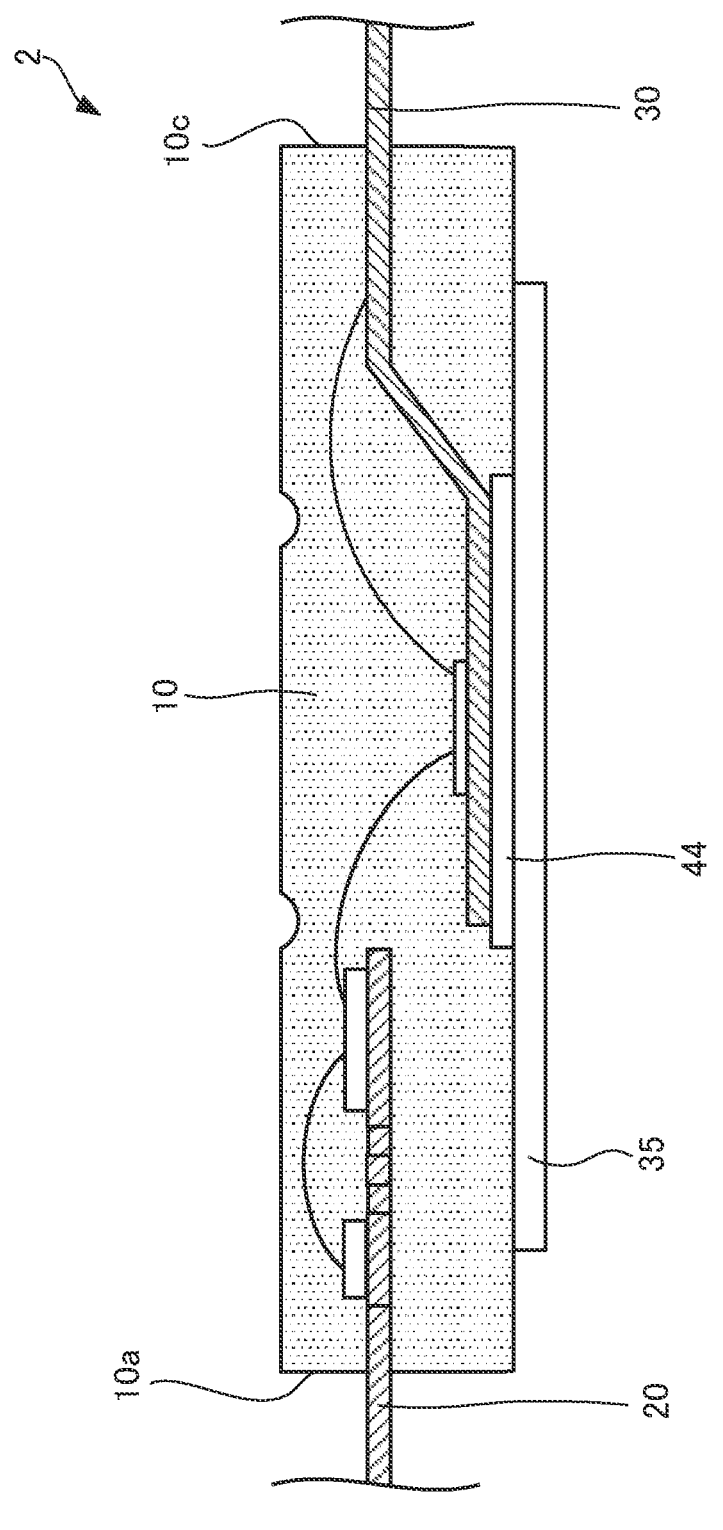
FIG. 7 is a transverse sectional view of the semiconductor module according to the first embodiment.

Next, the semiconductor module 2 will be described in detail with reference to FIGS. 3 to 7. FIG. 3 is a plan view of the semiconductor module according to the first embodiment. FIG. 4 is a bottom view of the semiconductor module according to the first embodiment. FIGS. 5A and 5B are each a side view of the semiconductor module according to the first embodiment. FIG. 6 is a longitudinal sectional view of the semiconductor module according to the first embodiment. FIG. 7 is a transverse sectional view of the semiconductor module according to the first embodiment. FIG. 5A is a side view of the semiconductor module 2 in FIG. 3 seen in the Y direction. FIG. 5B is a side view of the semiconductor module 2 in FIG. 3 seen in the +X direction. FIG. 7 is a sectional view taken along a dashed-dotted line Y1-Y1 in FIG. 6.

First, in FIG. 3, the as illustrated semiconductor module 2 is formed in a three-dimensional shape and includes a sealed main body portion 10 sealing components of the semiconductor module 2. The sealed main body portion 10 of the semiconductor module 2 has a cubic shape. Corner portions of the sealed main body portion 10 may be rounded. In addition, the sealed main body portion 10 has a front surface 10e and a rear surface 10f each having a rectangular shape in plan view. The front surface 10e and the rear surface 10f of the sealed main body portion 10 are surrounded in four directions by a pair of long side surfaces 10a and 10c facing each other and a pair of short side surfaces 10b and 10d facing each other. That is, the sealed main body portion 10 is surrounded in four directions by one long side surface 10a, one short side surface 10b, the other long side surface 10c, and the other short side surface 10d in this order, which will be referred to as one long side, one short side, the other long side, and the other short side, as needed.

The front surface of the semiconductor module 2 corresponds to the front surface 10e of the sealed main body portion 10. That is, the rear surface of an insulating plate 44 is exposed from the rear surface 10f of the sealed main body portion 10. The rear surface of the insulating plate 44 and the rear surface 10f of the sealed main body portion 10 are on the same plane. In addition, as illustrated in FIG. 4, the heat dissipation plate 35 is disposed on the rear surface of the insulating plate 44 and the rear surface 10f of the sealed main body portion 10.

The semiconductor module 2 includes the pair of attachment holes 11 each of which is beside the heat dissipation plate 35 and near a corresponding one of the short side surfaces 10b and 10d in plan view (of the rear surface 10f). The pair of attachment holes are each formed on a center line that runs through the center of the short side surface 10b and the center of the short side surface 10d. The attachment holes 11 each have a diameter into which the shaft portion 4a of the corresponding screw 4 is insertable. The rear surface supporting portions 12 are formed further outside the attachment holes 11 on the rear surface 10f of the semiconductor module 2. Each of the rear surface supporting portions 12 has at least a length that is parallel to a corresponding one of the opposite short side surfaces 10b and 10d and that corresponds to the width of a corresponding one of the pair of attachment holes 11 and is formed to face the corresponding attachment hole 11. The rear surface supporting portions 12 each have a rectangular shape in plan view (of the rear surface 10f). The rear surface supporting portions 12 are formed along the short side surfaces 10b and 10d in plan view (of the rear surface 10f). The width of the individual rear surface supporting portion 12 (the length in the +Y directions, the length in the direction in which the long sides of the semiconductor module 2 extend) corresponds to the length from the corresponding attachment hole 11 to the corresponding one of the short side surfaces 10b and 10d. The individual rear surface supporting portion 12 (in the +X directions) is continuously along the formed corresponding one of the opposite short side surfaces 10b and 10d from one long side surface 10a to the other long side surface 10c. That is, the length of the individual rear surface supporting portion 12 in the #X direction extends from an area near the long side surface 10a to an area near the long side surface 10c.

A plurality of control lead frames 20 vertically extend from the long side surface 10a of the sealed main body portion 10 of the semiconductor module 2. In addition, a plurality of main current lead frames 30 vertically extend from the long side surface 10c of the sealed main body portion 10 of the semiconductor module 2. In this case, the main current lead frames 30 are formed at predetermined intervals on the long side surface 10c of the sealed main body portion 10.

Components of the semiconductor module 2 as illustrated in FIGS. 6 and 7 are sealed with the sealed main body portion 10. In addition, the sealed main body portion 10 is integrally formed with the rear surface supporting portions 12. The semiconductor module 2 includes three semiconductor chips 41a, semiconductor chips 41b to 41d, the control lead frames 20, the main current lead frames 30, control ICs 42a and 42b, electronic components 43, and the insulating plate 44. That is, the three semiconductor chips 41a, the semiconductor chips 41b to 41d, the control lead frames 20, the main current lead frames 30, the control ICs 42a and 42b, the electronic components 43, and the insulating plate 44 are set in a predetermined mold. This mold includes portions corresponding to the rear surface supporting portions 12. The mold is filled with sealing raw material of the sealed main body portion 10. After the sealing raw material is solidified, the mold is removed. As a result, the semiconductor module 2 including the rear surface supporting portions 12 is obtained. Thus, the sealed main body portion 10 and the rear surface supporting portions 12 may be made of the same material.

The control IC 42a is electrically and mechanically connected to the three semiconductor chips 41a via control wires 45a. In addition, the control IC 42a is electrically and mechanically connected to the electronic components 43 and some of the control lead frames 20 via control wires 45a.

In addition, the three semiconductor chips 41a are electrically and mechanically connected to some of the main current lead frames 30 via main current wires 45b. The semiconductor chips 41b to 41d are electrically and mechanically connected to some of the main current lead frames 30 via main current wires 45b.

These control wires 45a and main current wires 45b are made of material having excellent electrical conductivity. The material is, for example, gold, silver, copper, aluminum, or an alloy containing at least one of these kinds. The individual control wire 45a has a diameter, for example, between 10 μm and 250 μm, inclusive. The individual main current wire 45b has a diameter, for example, between 300 μm and 500 μm, inclusive.

The semiconductor chips 41a to 41d are each made of silicon, silicon carbide, or gallium nitride as its main component. These semiconductor chips 41a to 41d each include a reverse conducting (RC)-IGBT as a switching element, which is obtained by forming an IGBT and an FWD on a single chip. Each RC-IGBT chip includes a circuit in which an IGBT and an FWD are connected in reverse-parallel to each other. Each of these semiconductor chips 41a to 41d includes an input electrode (a collector electrode) as a main electrode on its rear surface. In addition, each of the semiconductor chips 41a to 41d has a control electrode (a gate electrode) and an output electrode (an emitter electrode) on its front surface. The gate electrodes of the semiconductor chips 41a to 41d illustrated in FIG. 6 are disposed to face in the direction of the long side surface 10c. The semiconductor chips 41a to 41d each have a thickness, for example, between 50 μm and 220 μm, inclusive. Six pairs of semiconductor chips, each pair being a semiconductor chip including a switching element and a semiconductor chip including a diode element, may be disposed in place of these semiconductor chips 41a to 41d. In this case, the switching elements of the semiconductor chips 41a to 41d are, for example, power MOSFETs or IGBTs. Each of these semiconductor chips 41a to 41d includes, for example, a drain electrode (a positive electrode or a collector electrode in the case of an IGBT) as a main electrode on its rear surface and a gate electrode (a control electrode) as a control electrode and a source electrode (a negative electrode or an emitter electrode in the case of an IGBT) as a main electrode on its front surface. The diode elements of the semiconductor chips are FWDs such as SBDs or PiN diodes. Each of these semiconductor chips includes a cathode electrode as a main electrode on its rear surface and an anode electrode as a main electrode on its front surface. In addition, while the six semiconductor chips 41a to 41d are arranged in the present embodiment, the number of semiconductor chips is not limited to 6. A different number of pairs of semiconductor chips may be disposed, for example, depending on the specifications of the semiconductor module 2.

Each of the rear surfaces of the semiconductor chips 41a to 41d is bonded to a predetermined one of the main current lead frames 30 via solder (not illustrated). The solder is lead-free solder containing a predetermined alloy as its main component. The predetermined alloy is at least one of a tin-silver alloy, a tin-zinc alloy, and a tin-antimony alloy, for example. An additive such as copper, bismuth, indium, nickel, germanium, cobalt, or silicon may be contained in the solder. Instead of soldering, the above bonding may be performed by sintering using sintered material. In this case, the sintered material is, for example, silver, gold, or copper powder.

The main electrodes on the front surfaces of the semiconductor chips 41a to 41d are electrically and mechanically connected to their respective main current lead frames 30 via their respective main current wires 45b. In addition, the gate electrodes on the front surfaces of the semiconductor chips 41a are electrically and mechanically connected to the control IC 42a via their respective control wires 45a. The gate electrodes on the front surfaces of the semiconductor chips 41b to 41d are electrically and mechanically connected to the control IC 42b via their respective control wires 45a.

The plurality of main current lead frames 30 are each formed on the long side surface 10c of the sealed main body portion 10 and each have one end portion extending from the long side surface 10c of the sealed main body portion 10 in the downward direction in FIG. 6. The main current lead frames 30, on which the semiconductor chips 41a to 41d are disposed, is each formed by a main die pad portion, a linkage portion, and a main current terminal portion, which are integrally connected to each other. The semiconductor chips 41a to 41d are disposed on their respective main die pad portions. The main current terminal portions extend to the outside from the long side surface 10c. Each of the linkage portions connects a corresponding one of the main die pad portions and a corresponding one of the main current terminal portions. The main current terminal portions are located at a higher level than the main die pad portions (in the +Z direction). That is, the main current terminal portions and the main die pad portions are located at different levels. The rear surfaces of the main die pad portions are attached to the insulating plate 44.

The plurality of control lead frames 20 are formed on the long side surface 10a opposite to the long side surface 10c from which the main current lead frames 30 of the sealed main body portion 10 extend. The plurality of control lead frames 20 are each formed at the same level inside the sealed main body portion 10. That is, the plurality of control lead frames 20 may extend in parallel to the front surface and the rear surface of the sealed main body portion 10. The plurality of control lead frames 20 are located at the same height as that of the main current terminal portions of the main current lead frames 30.

Among the plurality of control lead frames 20, the control lead frame 20 formed near the semiconductor chips 41a to 41d includes control die pads on which the control ICs 42a and 42b are disposed. One end portion of the control lead frame 20 extends into the sealed main body portion 10 from the long side surface 10a, and the middle portion of the control lead frame 20 extends by side portions of the semiconductor chips 41a to 41d. The other end portion of the control lead frame 20 extends to the outside from the long side surface 10a. Among the plurality of control lead frames 20, the control lead frames 20 on which the electronic components 43 are disposed include control die pads. The electronic components 43 are disposed on these control die pads.

The plurality of main current lead frames 30 and the plurality of control lead frames 20 as described above are made of material having excellent electrical conductivity. The material is, for example, copper, aluminum, or an alloy containing at least one of these kinds. The plurality of main current lead frames 30 and the plurality of control lead frames 20 each have a thickness preferably between 0.10 mm and 1.00 mm, inclusive, more preferably between 0.20 mm and 0.50 mm, inclusive. In addition, the plurality of main current lead frames 30 and the plurality of control lead frames 20 may each be plated with material having excellent corrosion resistance. The material is, for example, nickel, gold, or an alloy containing at least one of these kinds.

The sealed main body portion 10 contains thermosetting resin and inorganic filler contained therein. For example, the thermosetting resin contains, as its main component, at least one kind selected from a group including epoxy resin, phenol resin, and melamine resin. Preferably, the thermosetting resin contains epoxy resin as its main component. In addition, inorganic material having a high insulating property and high thermal conductivity is used as the inorganic filler. For example, the inorganic material contains, as its main component, at least one kind selected from a group including aluminum oxide, aluminum nitride, silicon nitride, and boron nitride. Preferably, the inorganic filler contains silicon oxide as its main component. By using silicon oxide, the inorganic filler also serves as mold release agent. In addition, it is possible to maintain a high flame retardance without blending halogen-based, antimony-based, or metal hydroxide-based flame retardant, for example. The inorganic filler is between 70% by volume and 90% by volume, inclusive, of the sealing raw material.

The insulating plate 44 is made of ceramic material or insulating resin. The ceramic material is aluminum oxide, aluminum nitride, silicon nitride, or the like. The insulating resin is a paper phenol board, a paper epoxy board, a glass composite board, or a glass epoxy board, for example.

The insulating plate 44 may be a sheet insulating plate made of resin. In this case, the insulating plate 44 contains thermosetting resin and inorganic filler contained therein. The thermosetting resin contains, as its main component, at least one kind selected from a group including epoxy resin, phenol resin, melamine resin, and polyimide resin, for example. Preferably, the thermosetting resin contains epoxy resin as its main component. In addition, inorganic material having a high insulating property and high thermal conductivity is used as the filler. For example, the inorganic material contains, as its main component, at least one kind selected from a group including aluminum oxide, aluminum nitride, silicon nitride, and boron nitride. It is preferable that the insulating plate 44 in this case contains, as its main component, the same thermosetting resin as that used for the sealed main body portion 10. More preferably, the thermosetting resin of the sealed main body portion 10 and the thermosetting resin of the insulating plate 44 both contain epoxy resin as their main component.

The insulating plate 44 has a rectangular shape in plan view, for example. The insulating plate 44 has a thickness between 50 μm and 1.2 mm, inclusive. On the front surface of the insulating plate 44, the main die pads of the plurality of main current lead frames 30 are disposed in a line in a longitudinal direction of the insulating plate 44. The insulating plate 44 has a size such that at least the plurality of main die pads are disposed. Thus, the insulating plate 44 may have a larger size than that illustrated in FIG. 6. Since the surrounding area of the main die pads is covered, even if the semiconductor module 2 is deformed, the insulating property is maintained more reliably. The insulating plate 44 transfers the heat, which is generated by the semiconductor chips 41a to 41d and transferred from the main die pad portion, to the heat dissipation plate 35 described below.

The heat dissipation plate 35 has a rectangular shape in plan view. The area of the heat dissipation plate 35 is sufficiently larger than the area of the insulating plate 44. The heat dissipation plate 35 is attached to the rear surface of the semiconductor module 2 such that the heat dissipation plate 35 covers the exposed insulating plate 44. The heat dissipation plate 35 releases the heat from the insulating plate 44 to the outside of the semiconductor module 2. That is, the heat dissipation plate 35 contributes to heat dissipation of the semiconductor module 2. In addition, the thickness Tc of the heat dissipation plate 35 is approximately equal to the height Ta of the individual rear surface supporting portion 12. For example, the thickness Tc and the height Ta are each between 95 μm and 110 μm, inclusive, for example, 100 μm.

Figure 8A:
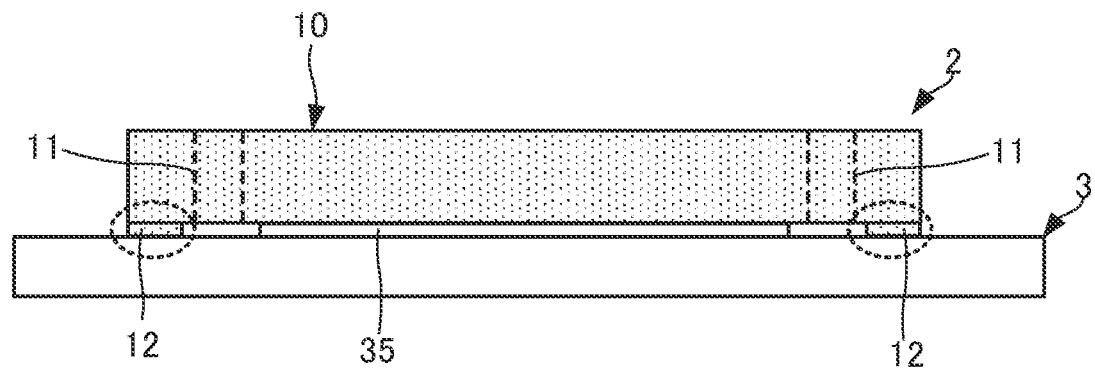
FIGS. 8A and 8B each illustrate attachment of the semiconductor module according to the first embodiment to a cooling board.
Figure 8B:
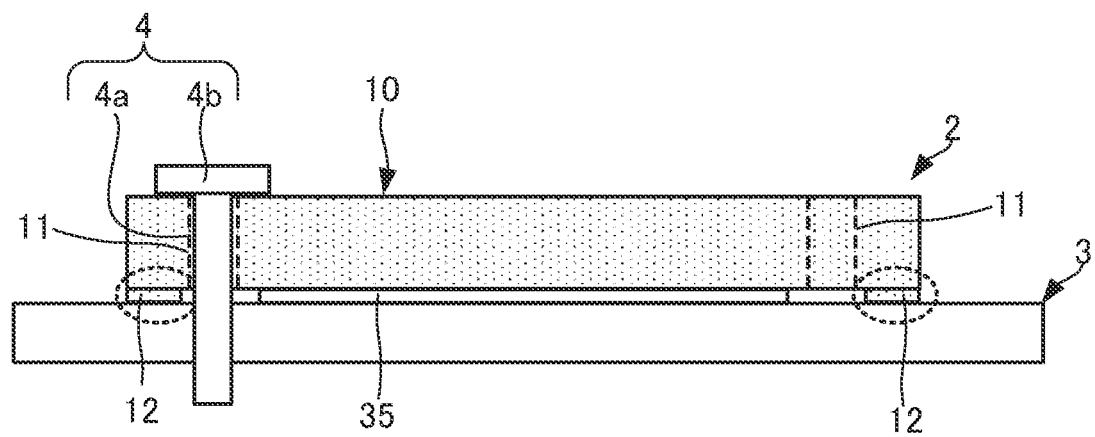

Next, attachment of the semiconductor module 2 of the semiconductor device 1 to the cooling board 3 with the screws 4 will be described with reference to FIGS. 8A and 8B. FIGS. 8A and 8B each illustrate attachment of the semiconductor module according to the first embodiment to the cooling board. FIGS. 8A and 8B are each a side view of the semiconductor device 1 illustrated in FIG. 1 seen in the +X direction. In addition, FIGS. 8A and 8B illustrate attachment of the semiconductor module 2 to the cooling board 3 in chronological order. Before this attachment is performed as follows, the semiconductor module 2, the cooling board 3, and the screws 4 as described above are prepared in advance.

First, the semiconductor module 2 is disposed on the front surface of the cooling board 3. In this step, the attachment holes 11 in the semiconductor module 2 are positioned with respect to the fixing holes 3a in the cooling board 3. The rear surface supporting portions 12 of the semiconductor module 2 and the heat dissipation plate 35 have substantially the same height (thickness). The rear surface supporting portions 12 of the semiconductor module 2 and the heat dissipation plate 35 are disposed on the front surface of the cooling board 3, as illustrated in FIG. 8A. When these components are disposed, the front surface 10e of the semiconductor module 2 is substantially horizontal to the front surface of the cooling board 3. In particular, since the rear surface supporting portions 12 are located on both sides of the heat dissipation plate 35 in the +Y directions, the semiconductor module 2 is disposed stably on the cooling board 3.

Next, the semiconductor module 2 is attached to the cooling board 3 with the screws 4. A screw 4 is inserted into one of the attachment holes 11 (the left attachment hole 11 in FIG. 8B) in the semiconductor module 2 toward the cooling board 3. This screw 4 inserted into the attachment hole 11 in the semiconductor module 2 is rotated clockwise and pressed against the cooling board 3. The screw 4 (the tip portion thereof) is engaged with the corresponding fixing hole 3a in the cooling board 3. In particular, the rear surface of the head portion 4b of the screw 4 is pressed against the periphery of the attachment hole 11 on the front surface 10e of the semiconductor module 2 toward the cooling board 3 (−Z direction). The heat dissipation plate 35 and the corresponding rear surface supporting portion 12 sandwiching this attachment hole 11 are formed on the rear surface 10f of the semiconductor module 2. Even when the semiconductor module 2 is pressed by the head portion 4b of the screw 4 toward the cooling board 3, the rear surface supporting portion 12 prevents an area around the other attachment hole 11 in the semiconductor module 2 from being lifted. In addition, since the rear surface supporting portions 12 and the heat dissipation plate 35 are present, the position of the semiconductor module 2 is not easily shifted from the cooling board 3 in the X-Y plane direction. Thus, the semiconductor module 2 is stably fixed to the cooling board 3 with the screw 4 without fail. After one screw 4 is inserted into one of the attachment holes 11 and is engaged with one of the fixing holes 3a, the other screw 4 is inserted into the other attachment hole 11 and is engaged with the other fixing hole 3a in the cooling board 3 in the same way. Consequently, the semiconductor device 1 illustrated in FIGS. 1 and 2 is obtained.

Figure 9A:
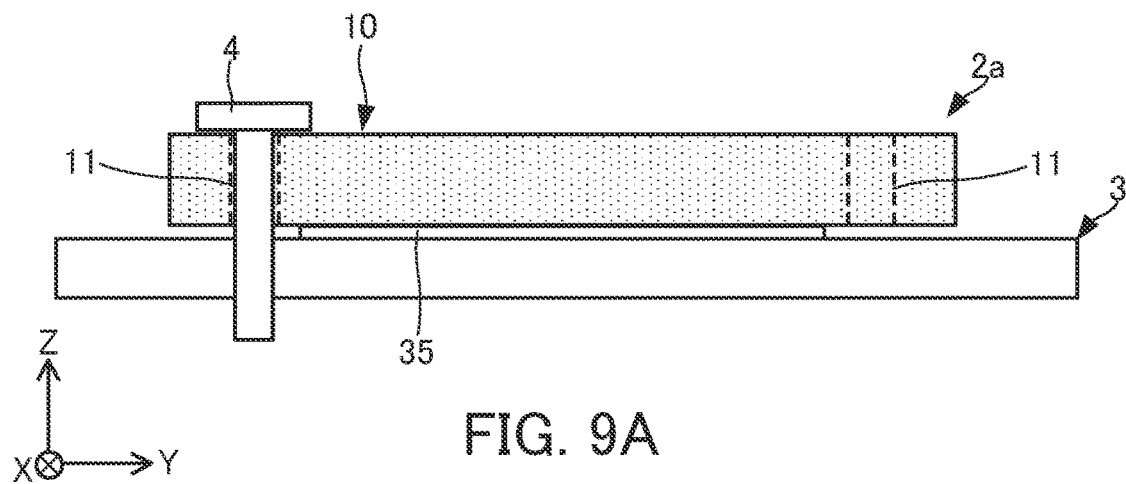
FIGS. 9A to 9C each illustrate attachment of a semiconductor module according to a reference example to a cooling board.
Figure 9B:
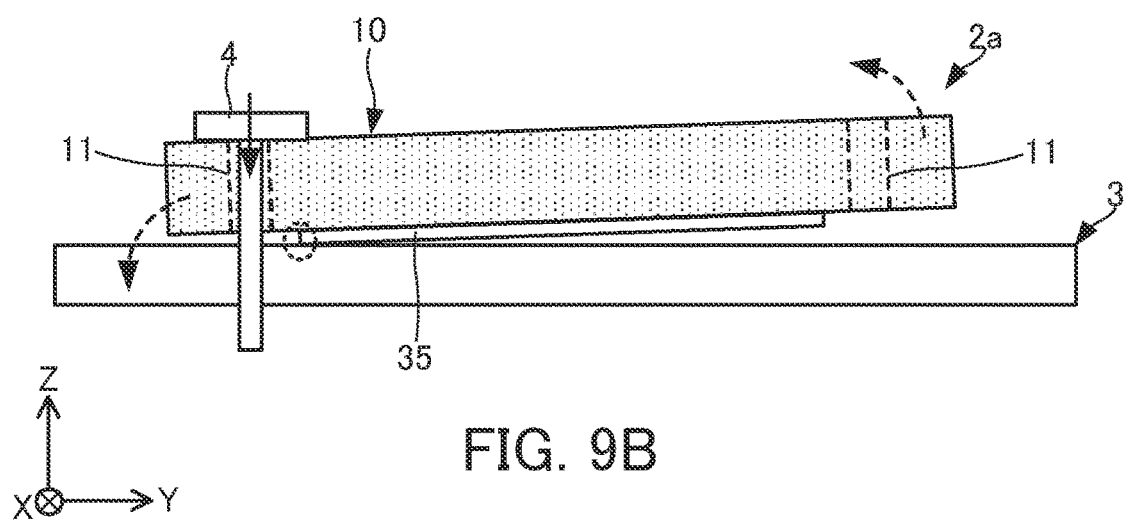
Figure 9C:
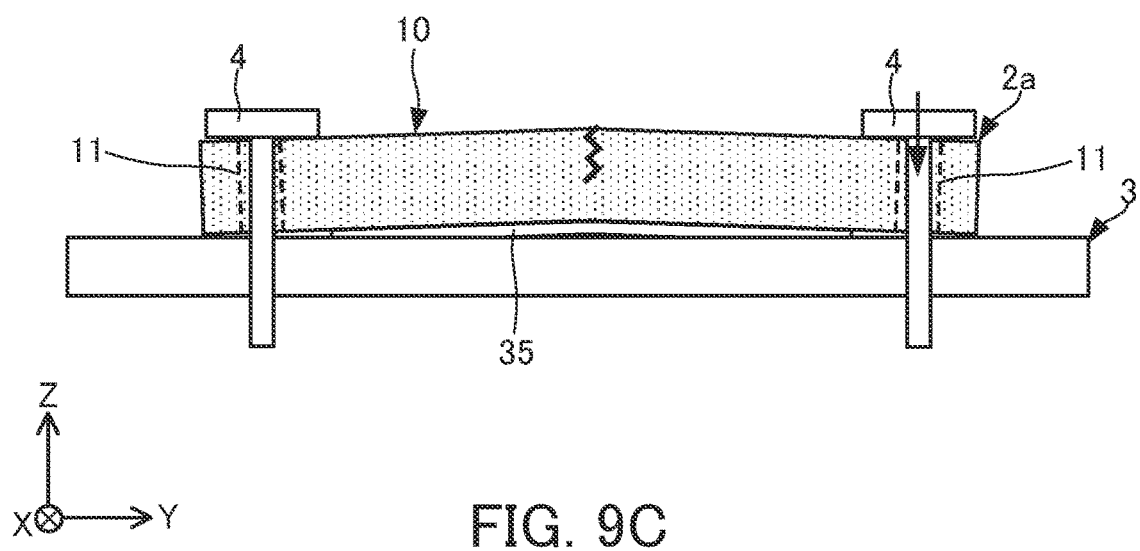

Next, a reference example, which will be compared with the semiconductor device 1 according to FIGS. 1 and 2, will be described. In the reference example, attachment of a semiconductor module 2a without the above rear surface supporting portions 12 to the cooling board 3 with the screws 4 will be described with reference to FIGS. 9A to 9C. FIGS. 9A to 9C each illustrate attachment of the semiconductor module according to the reference example to the cooling board. FIGS. 9A to 9C are each a side view of a semiconductor device 1 according to the reference example seen from the +X direction. FIGS. 9A to 9C illustrate attachment of the semiconductor module 2a to the cooling board 3 in chronological order. The rear surface supporting portions 12 of the semiconductor module 2 are absent in the semiconductor module 2a. The other components of the semiconductor module 2a are the same as those of the semiconductor module 2.

First, the semiconductor module 2a is disposed on the front surface of the cooling board 3. In this step, the attachment holes 11 in the semiconductor module 2a are positioned with respect to the fixing holes 3a in the cooling board 3. The rear surface 10f of the semiconductor module 2a is supported by the heat dissipation plate 35, and the front surface 10e of the semiconductor module 2a and the front surface of the cooling board 3 are substantially parallel to each other.

Next, the semiconductor module 2a is attached to the cooling board 3 with the screws 4. A screw 4 is inserted into one of the attachment holes 11 (the left attachment hole 11 in FIGS. 9A to 9C) in the semiconductor module 2a toward the cooling board 3 (FIG. 9A).

The screw 4 inserted into the attachment hole 11 in the semiconductor module 2a is rotated clockwise and pressed toward the cooling board 3. That is, one of the attachment holes 11 in the semiconductor module 2a is pressed toward the cooling board 3. As a result, an end portion (a corner portion) of the heat dissipation plate 35 serves as a fulcrum, and an area around the other attachment hole 11 in the semiconductor module 2a is lifted from the cooling board 3 (FIG. 9B).

In this state in which the area around the other attachment hole 11 is lifted, the other screw 4 is inserted into the other attachment hole 11 in the semiconductor module 2a and is engaged with the other fixing hole 3a in the cooling board 3. In this state in which one attachment hole 11 in the semiconductor module 2a has already been fixed to the cooling board 3, if the other attachment hole 11 is attached to the cooling board 3 with the other screw 4, the semiconductor module 2a is warped convexly upward, as illustrated in FIG. 9C. Thus, stress is applied to the middle portion of the semiconductor module 2a, and a crack occurs in the sealed main body portion 10 of the semiconductor module 2a. Depending on the strength of the stress and the direction of occurrence of the stress, the semiconductor chips 41a to 41d and the insulating plate 44 in the semiconductor module 2a are damaged, and the control wires 45a and the main current wires 45b are peeled.

The above semiconductor device 1 includes the semiconductor module 2, the screws 4, and the cooling board 3. The semiconductor module 2 includes the semiconductor chips 41a to 41d and the sealed main body portion 10 including the semiconductor chips 41a to 41d sealed with sealing material, having a cuboid shape, having the rear surface 10f from which the main surface of the heat dissipation plate 35 protrudes, and having the pair of attachment holes 11 penetrating therethrough from the front surface 10e to the rear surface 10f. The heat dissipation plate 35 is positioned between the attachment holes 11 in plan view. The cooling board 3 has a flat plate shape, and the heat dissipation plate 35 of the semiconductor module 2 is disposed on the cooling board 3. The screws 4 are inserted into the pair of attachment holes 11 and are engaged with the fixing holes 3a in the cooling board 3. In this way, the cooling board 3 is attached to the semiconductor module 2. The semiconductor module 2 includes the rear surface supporting portions 12, each of which protrudes from the rear surface 10f and between which the pair of attachment holes 11 and the heat dissipation plate 35 are positioned. When the semiconductor module 2 is attached to the cooling board 3 with one of the screws 4, the corresponding rear surface supporting portion 12 prevents the heat dissipation plate 35 from serving as a fulcrum and an area around the other attachment hole 11 in the semiconductor module 2 from being lifted. The semiconductor module 2 is maintained horizontally to the cooling board 3, and one of the screws 4 is inserted into one of the attachment holes 11 and is engaged with one of the fixing holes 3a in the cooling board 3. In addition, the other screw 4 is inserted into the other attachment hole 11 and is engaged with the other fixing hole 3a in the cooling board 3 without causing damage to the semiconductor module 2. Thus, the present embodiment prevents deterioration of the reliability of the semiconductor module 2 and the semiconductor device 1 including the semiconductor module 2. The rear surface supporting portions 12 may have any structure that prevents the semiconductor module 2 from being lifted significantly when the semiconductor module 2 is attached to the cooling board 3 with the individual screw 4. Thus, the height Ta of the individual rear surface supporting portion 12 may be different from the thickness Tc of the heat dissipation plate 35. The height Ta may be, for example, 60% or more of the thickness Tc.

(Variation 1-1)

Figure 10:
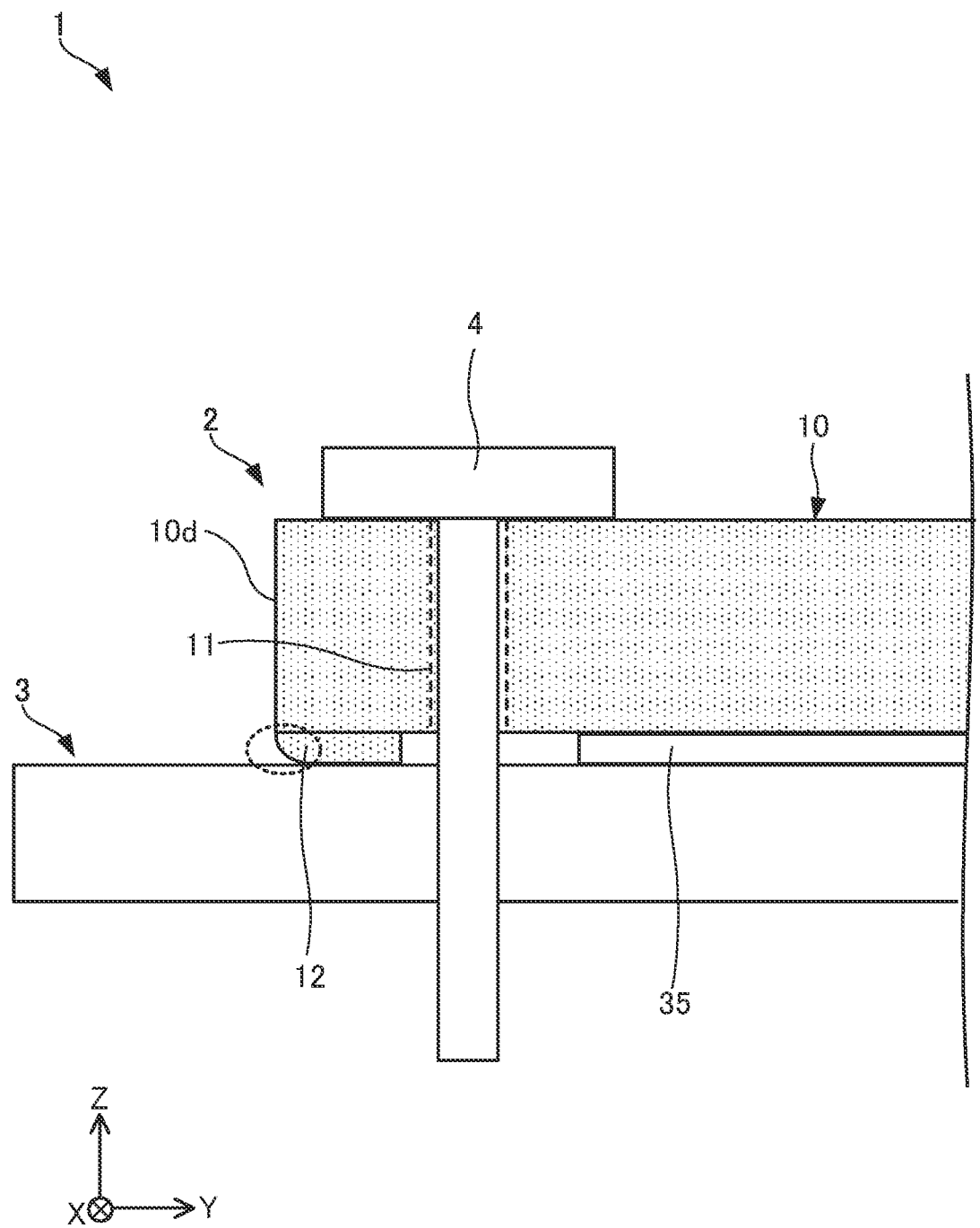
FIG. 10 is a transverse sectional view of a main portion of a semiconductor device according to variation 1-1 of the first embodiment.

A semiconductor device 1 according to variation 1-1 will be described with reference to FIG. 10. FIG. 10 is a transverse sectional view of a main portion of a semiconductor device according to variation 1-1 of the first embodiment. FIG. 10 is an enlarged view of the left attachment hole 11 in the semiconductor device 1 in FIG. 2. The semiconductor device 1 according to variation 1-1 differs from the semiconductor module 2 in FIGS. 1 and 2 only in the shape of the individual rear surface supporting portion 12 of the semiconductor module 2. The other components of the semiconductor device 1 according to variation 1-1 are the same as those illustrated in FIGS. 1 and 2.

Outside corner portions of the rear surface supporting portions 12 of the semiconductor module 2 according to variation 1-1 (corner portions near the short side surfaces 10b and 10d. In FIG. 10, the corner portion near the short side surface 10d) are rounded. When this semiconductor module 2 is attached to the cooling board 3 with a screw 4, the corresponding rear surface supporting portion 12 having a rounded corner portion easily comes into contact with the front surface of the cooling board 3. Thus, the semiconductor module 2 is attached to the cooling board 3 with the screws 4 more stably. In addition, other than the corner portions near the short side surfaces 10b and 10d, the corner portions near the long side surfaces 10a and 10c of the rear surface supporting portions 12 may also be rounded.

(Variation 1-2)

Figure 11:
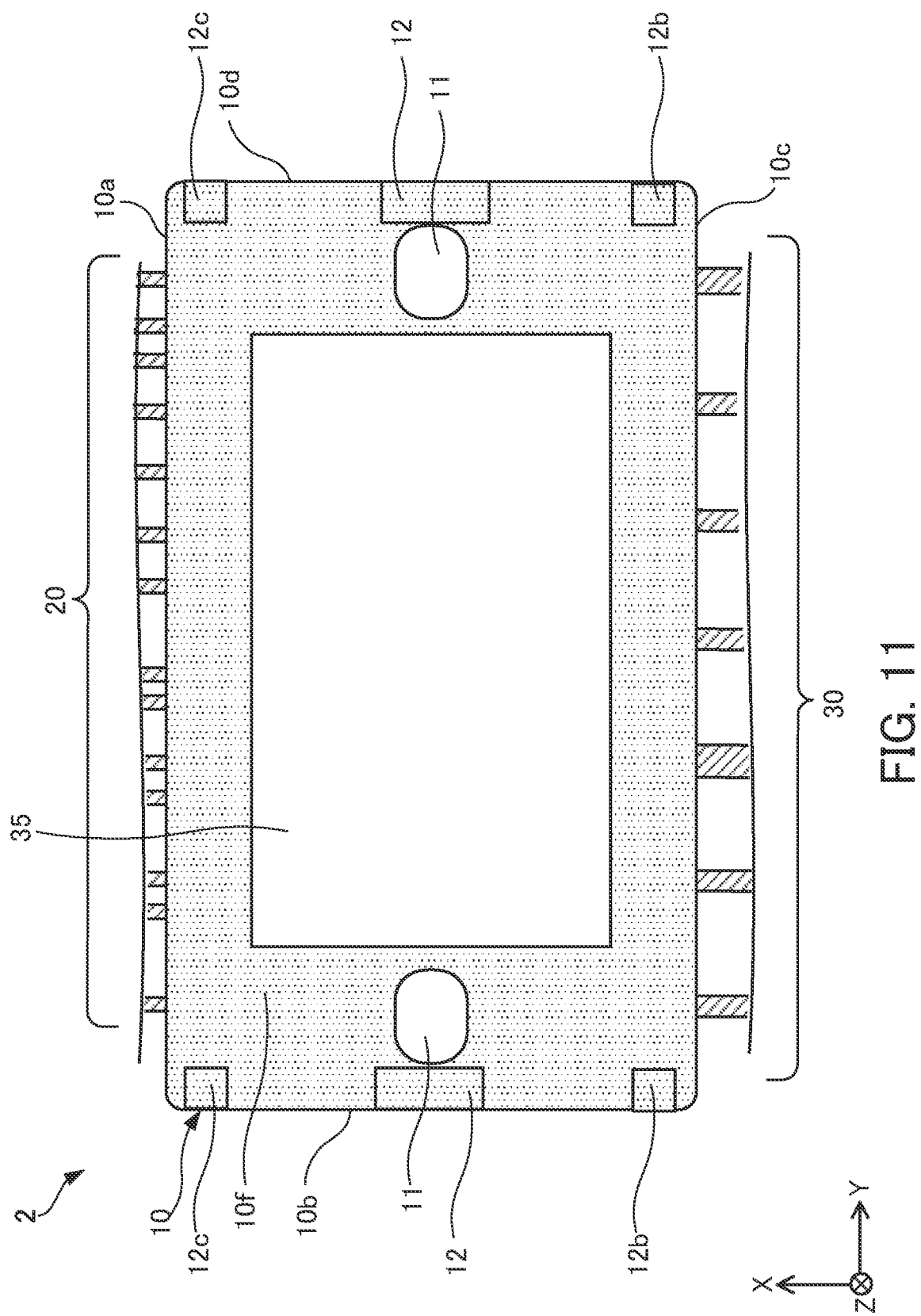
FIG. 11 is a bottom view of a semiconductor module according to variation 1-2 of the first embodiment.

A semiconductor module 2 according to variation 1-2 will be described with reference to FIG. 11. FIG. 11 is a bottom view of the semiconductor module according to variation 1-2 of the first embodiment. The semiconductor module 2 according to variation 1-2 differs from the semiconductor module 2 in FIGS. 1 and 2 only in the shape of the individual rear surface supporting portion 12 of the semiconductor module 2. The other components of the semiconductor device 1 according to variation 1-2 are the same as those illustrated in FIGS. 1 and 2.

A plurality of rear surface supporting portions 12, 12b, and 12c are formed along the opposite short side surfaces 10b and 10d on the rear surface 10f of the semiconductor module 2 according to variation 1-2. Each of the rear surface supporting portions 12 is formed on an area adjacent to a corresponding one of the attachment holes 11 in the direction of a corresponding one of the short side surfaces 10b and 10d on the rear surface 10f of the semiconductor module 2. Each of the rear surface supporting portions 12c is formed on an area adjacent to the above area in the direction of the long side surface 10a. In addition, each of the rear surface supporting portions 12b is formed on an area adjacent to the above area in the direction of the long side surface 10c. That is, the rear surface supporting portions 12b and 12c are formed along the short side surfaces 10b and 10d adjacent to the rear surface supporting portions 12.

Unlike the rear surface supporting portions 12 in FIGS. 1 and 2, while the rear surface supporting portions 12, 12b, and 12c are not integrally formed, the same advantageous effects as those described with reference to FIGS. 1 and 2 are obtained. The rear surface supporting portions 12 according to variation 1-2 need to be formed at least in areas adjacent to their respective attachment holes 11 in the direction of their respective short side surfaces 10b and 10d. That is, the rear surface supporting portions 12 and the attachment holes 11 are formed in a line. It is preferable that the length of the individual rear surface supporting portion 12 (in the ±X directions) be equal to or longer than the length of the individual attachment hole 11 (in the ±X directions). In addition, the rear surface supporting portions 12 are formed at least in portions adjacent to their respective attachment holes 11 in the direction of their respective short side surfaces 10b and 10d. Thus, the individual rear surface supporting portion 12 may be formed in a portion surrounding the corresponding attachment hole 11, for example. A plurality of rear surface supporting portions 12b and a plurality of rear surface supporting portions 12c may be formed along each of the short side surfaces 10b and 10d.

(Variation 1-3)

Figure 12:
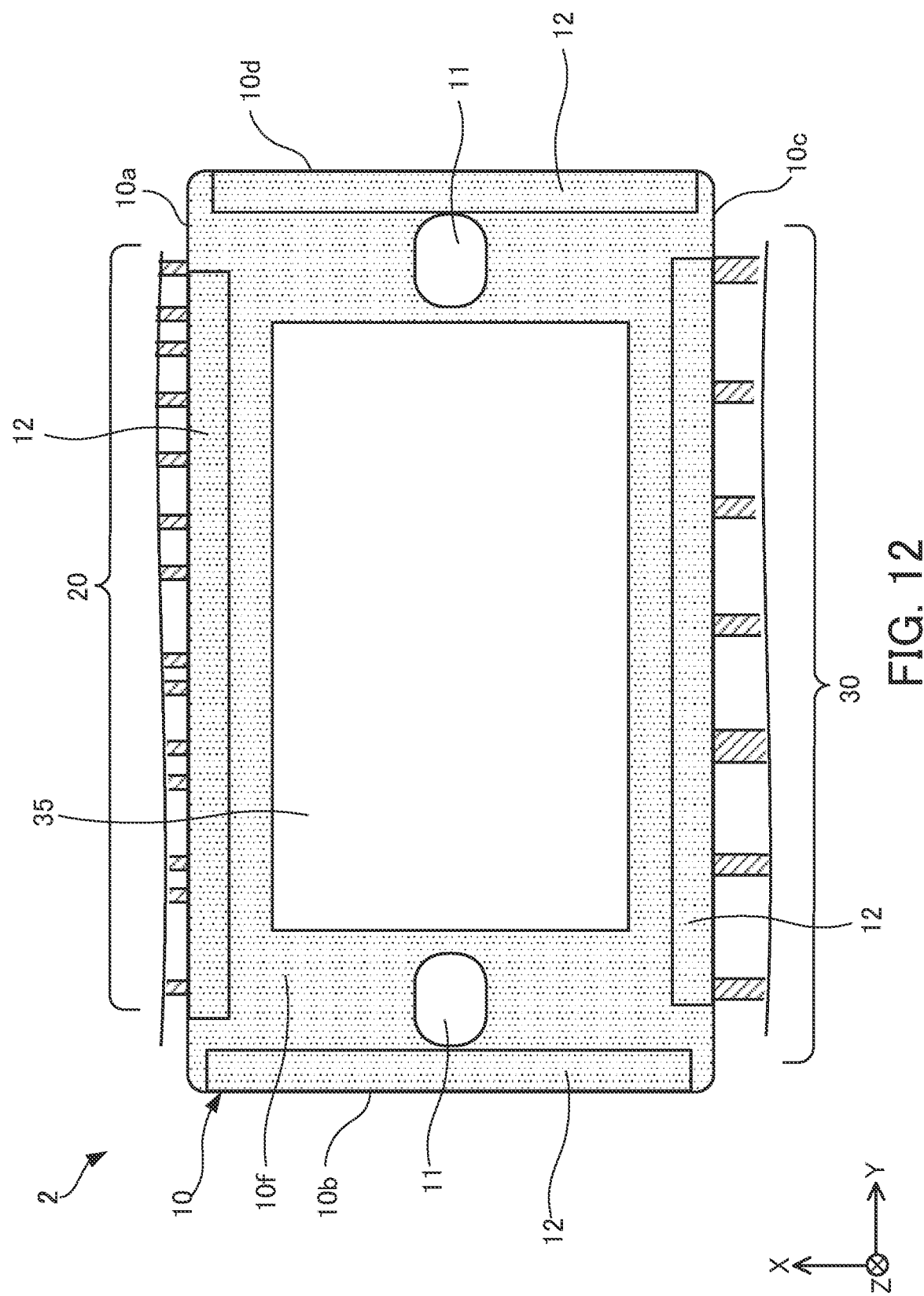
FIG. 12 is a bottom view of a semiconductor module according to variation 1-3 of the first embodiment.

A semiconductor module 2 according to variation 1-3 will be described with reference to FIG. 12. FIG. 12 is a bottom view of the semiconductor module according to variation 1-3 of the first embodiment. The semiconductor module 2 according to variation 1-3 further includes rear surface supporting portions 12 along the long side surfaces 10a and 10c on the rear surface 10f of the semiconductor module 2, in addition to the rear surface supporting portions 12 of the semiconductor module 2 illustrated in FIGS. 1 and 2. The other components of the semiconductor module 2 according to variation 1-3 are the same as those as illustrated in FIGS. 1 and 2.

The semiconductor module 2 according to variation 1-3 includes the rear surface supporting portions 12 not only along the short side surfaces 10b and 10d but also along the long side surfaces 10a and 10c on the rear surface 10f. Thus, the semiconductor module 2 according to variation 1-3 is fixed to the cooling board 3 with the screws 4 more stably than the case illustrated in FIGS. 1 and 2.

The individual rear surface supporting portion 12 according to variation 1-3 may be formed discontinuously along the long side surfaces 10a and 10c and the short side surfaces 10b and 10d on the rear surface 10f of the semiconductor module 2, as in variation 1-2.

Second Embodiment

Figure 13:
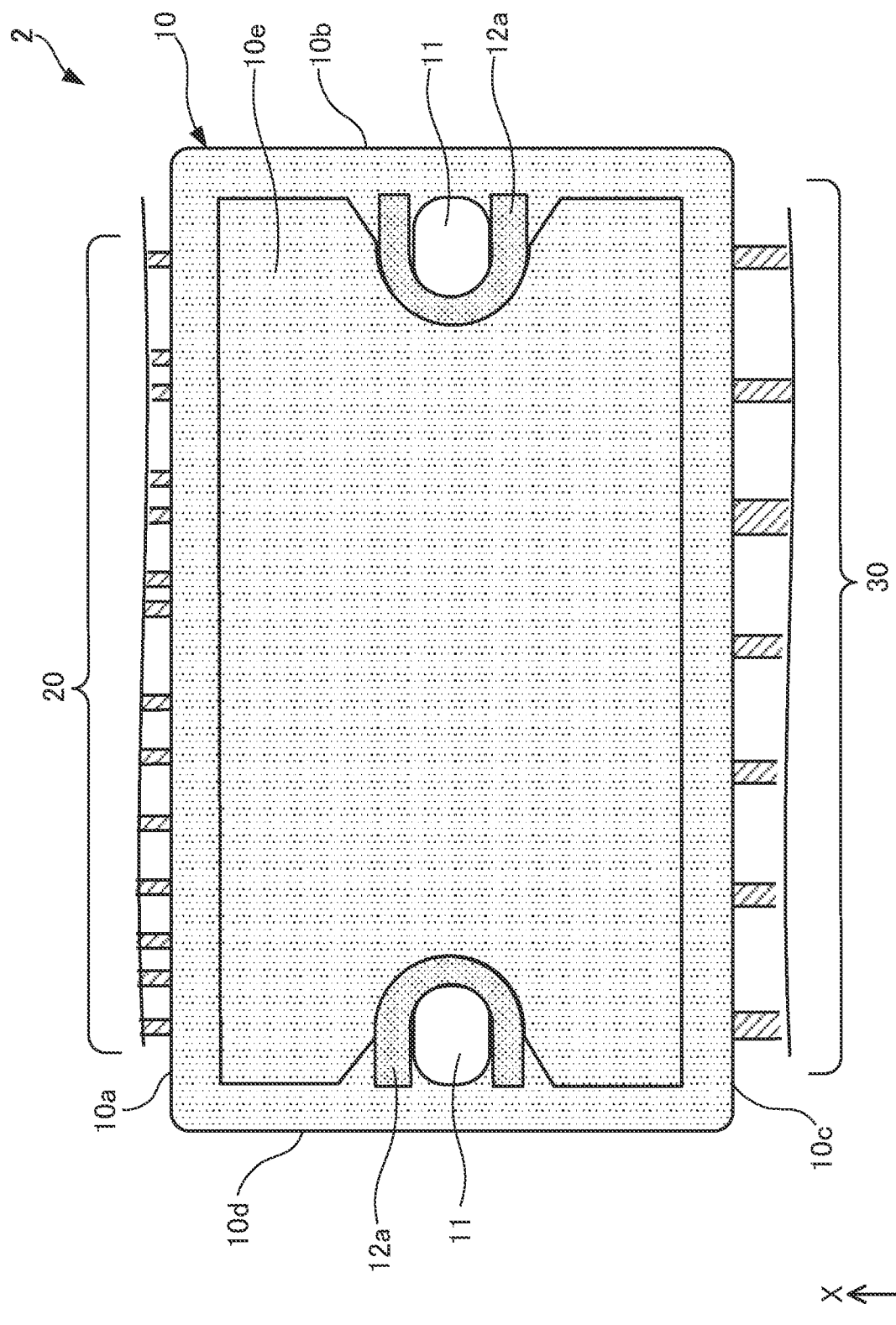
FIG. 13 is a plan view of a semiconductor module according to a second embodiment.
Figure 14:
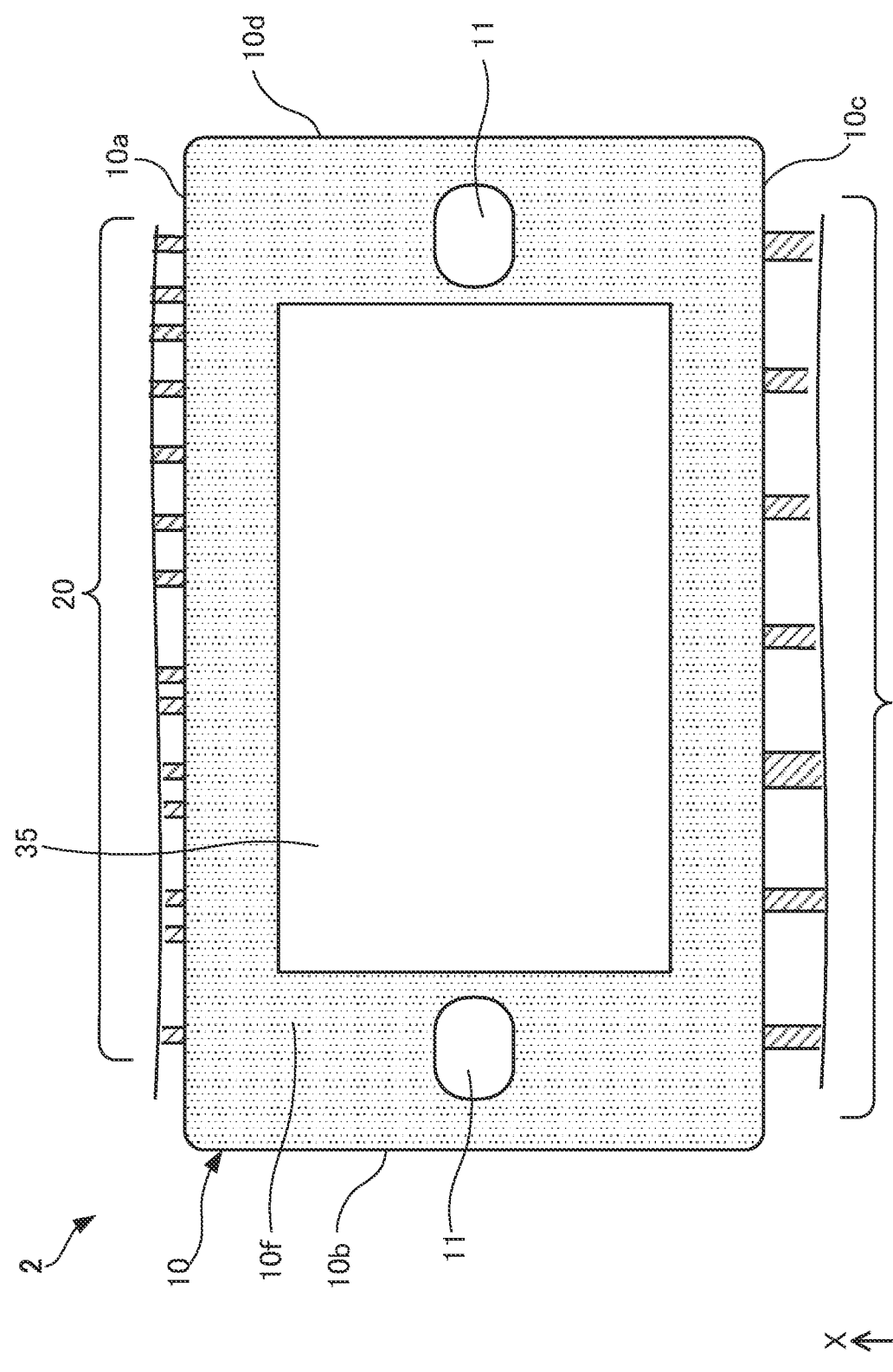
FIG. 14 is a bottom view of the semiconductor module according to the second embodiment.
Figure 15A:
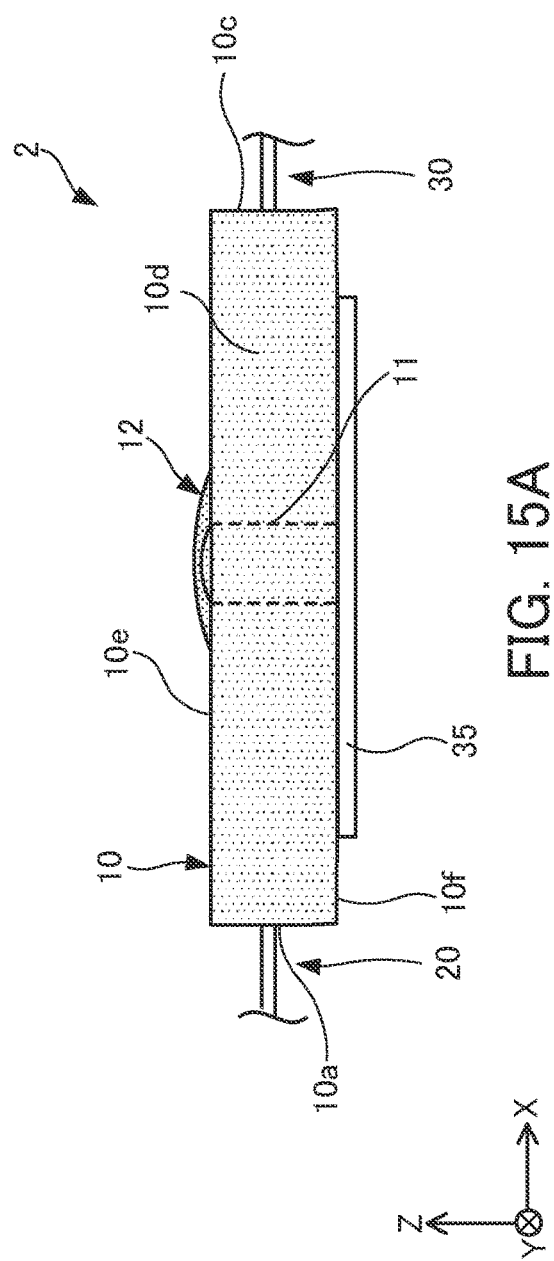
FIGS. 15A and 15B are each a side view of the semiconductor module according to the second embodiment.
Figure 15B:
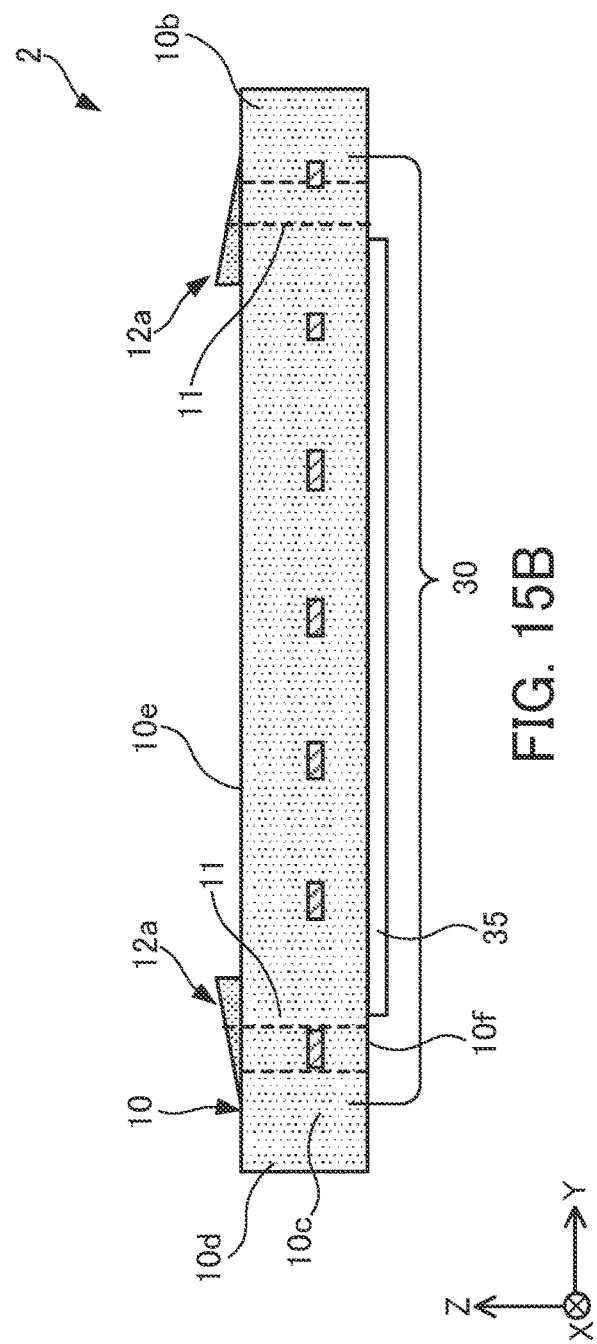

A semiconductor module included in a semiconductor device according to a second embodiment will be described with reference to FIGS. 13 to 15. FIG. 13 is a plan view of the semiconductor module according to the second embodiment. FIG. 14 is a bottom view of the semiconductor module according to the second embodiment. In addition, FIGS. 15A and 15B are each a side view of the semiconductor module according to the second embodiment. FIGS. 15A and 15B correspond to FIGS. 5A and 5B, respectively. That is, FIG. 15A is a side view of the semiconductor module 2 in FIG. 13 seen from the Y direction. FIG. 15B is a side view of the semiconductor module in FIG. 13 seen from the +X direction. The semiconductor device according to the second embodiment includes the semiconductor module 2 according to the second embodiment, unlike those illustrated in FIGS. 1 and 2. The cooling board 3 is the same as that according to the first embodiment.

The semiconductor module 2 according to the second embodiment does not include the rear surface supporting portions 12 of the semiconductor module 2 according to the first embodiment but includes front surface supporting portions 12a. The front surface supporting portions 12a are each formed to protrude from the front surface 10e of the semiconductor module 2 and is located substantially between the pair of opposite attachment holes 11 in plan view.

That is, the individual front surface supporting portion 12a is formed to surround the periphery of a corresponding one of the attachment holes 11, except an area facing a corresponding one of the short side surfaces 10b and 10d in plan view. The individual front surface supporting portion 12a includes a sloping surface in side view, as illustrated in FIGS. 15A and 15B. A point on the individual sloping surface that is farther from the corresponding one of the short side surfaces 10b and 10d has a higher height from the front surface 10e of the semiconductor module 2. The highest location of the individual front surface supporting portion 12a will be referred to as a point P (see FIGS. 17A and 17B). In this way, the individual front surface supporting portion 12a is formed with a slope (bank shape) along an outer periphery portion of the corresponding one of the attachment holes 11 (the outer periphery portion being opposite to the corresponding one of the short side surfaces 10b and 10d) on the front surface 10e of the semiconductor module 2.

No rear surface supporting portions 12 are formed on the rear surface 10f of the semiconductor module 2 according to the second embodiment. As illustrated in FIG. 14, the attachment holes 11 are formed near their respective short side surfaces 10b and 10d on the rear surface 10f of the semiconductor module 2. The heat dissipation plate 35 is formed between the pair of attachment holes 11 on the rear surface 10f of the semiconductor module 2.

As in the first embodiment, the three semiconductor chips 41a, the semiconductor chips 41b to 41d, the control lead frames 20, the main current lead frames 30, the control ICs 42a and 42b, the electronic components 43, and the insulating plate 44 of the semiconductor module 2 according to the second embodiment are set in a predetermined mold. This mold includes portions corresponding to the front surface supporting portions 12a. The mold is filled with sealing raw material of the sealed main body portion 10. After the sealing raw material is solidified, the mold is removed. As a result, the semiconductor module 2 including the front surface supporting portions 12a is obtained. Thus, the sealed main body portion 10 and the front surface supporting portions 12a may be made of the same material.

Figure 16A:
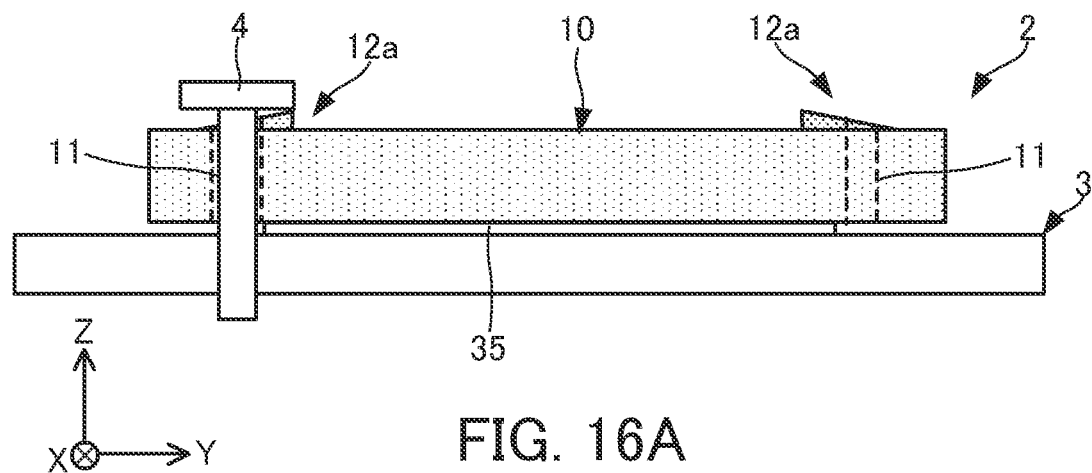
FIGS. 16A to 16C each illustrate attachment of the semiconductor module according to the second embodiment to a cooling board (part 1)
Figure 16B:
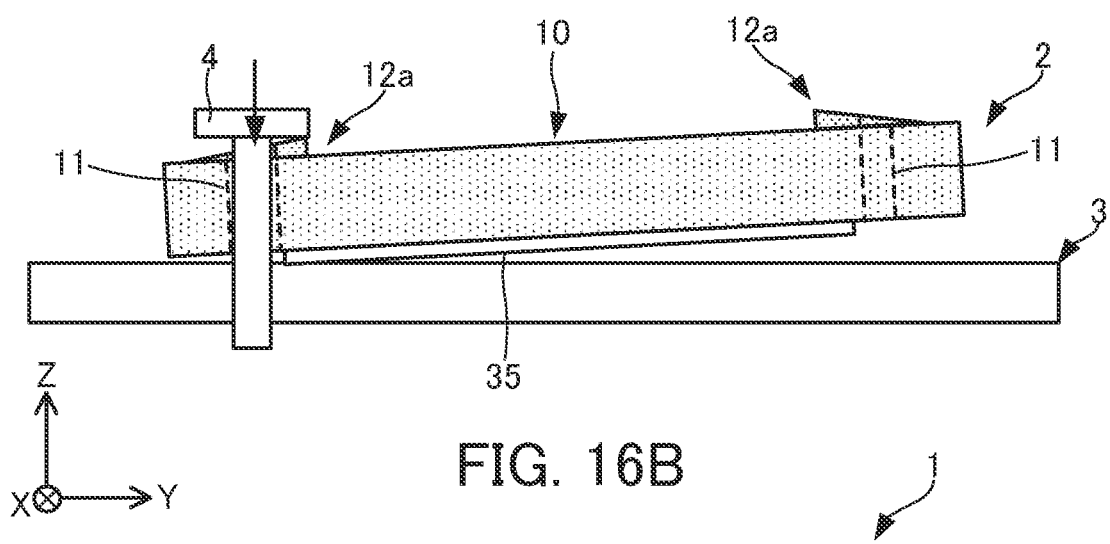
Figure 16C:
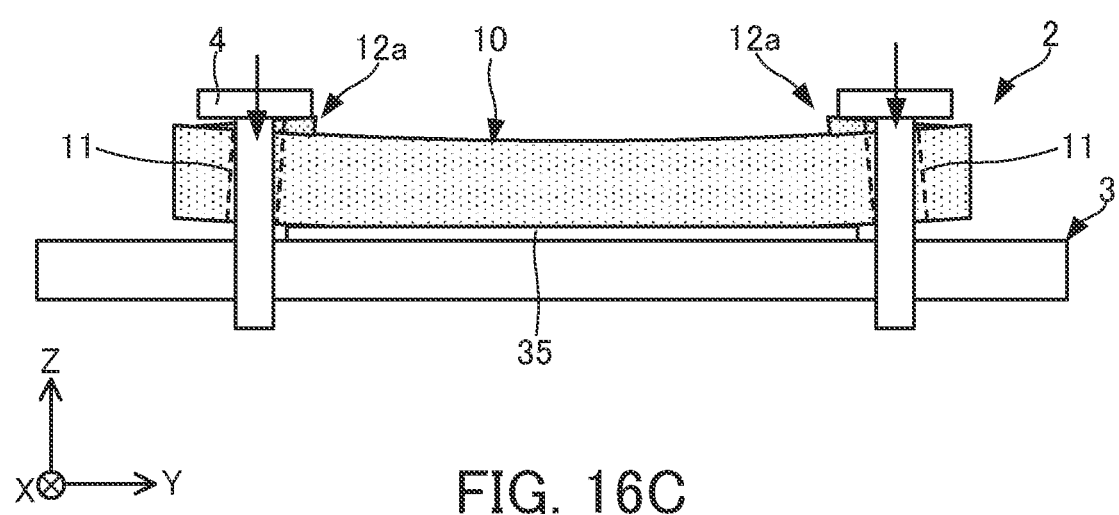
Figure 17A:
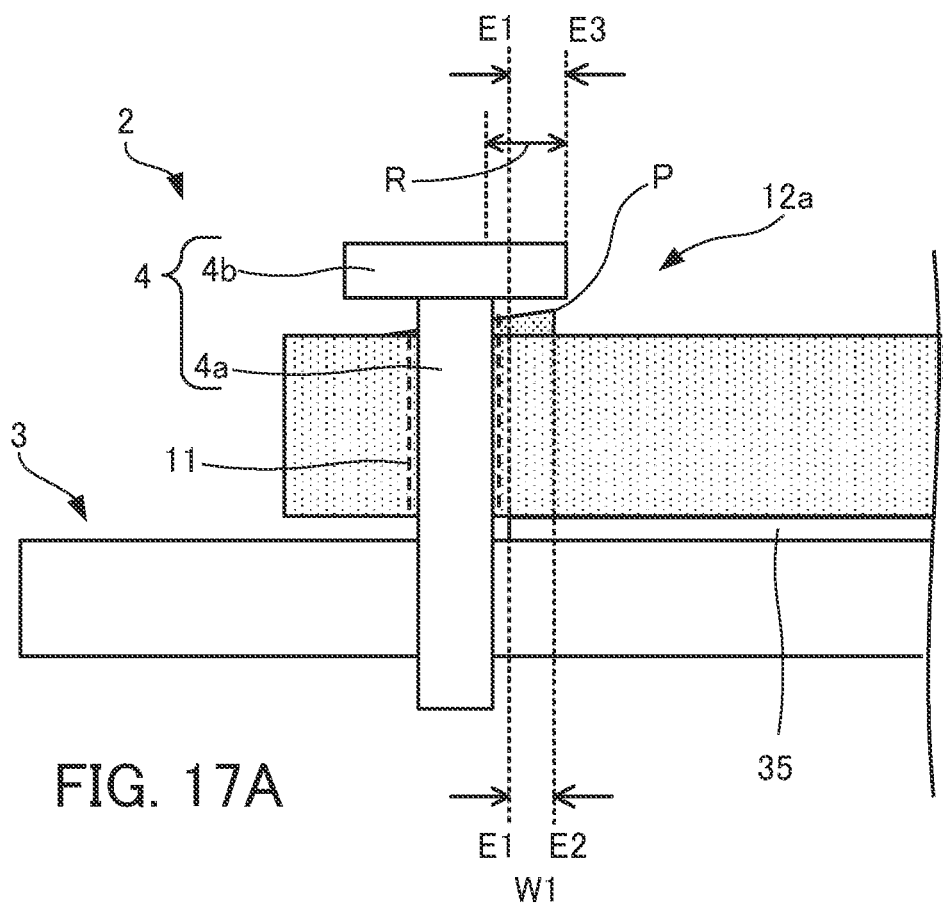
FIGS. 17A and 17B each illustrate attachment of the semiconductor module according to the second embodiment to a cooling board (part 2).
Figure 17B:
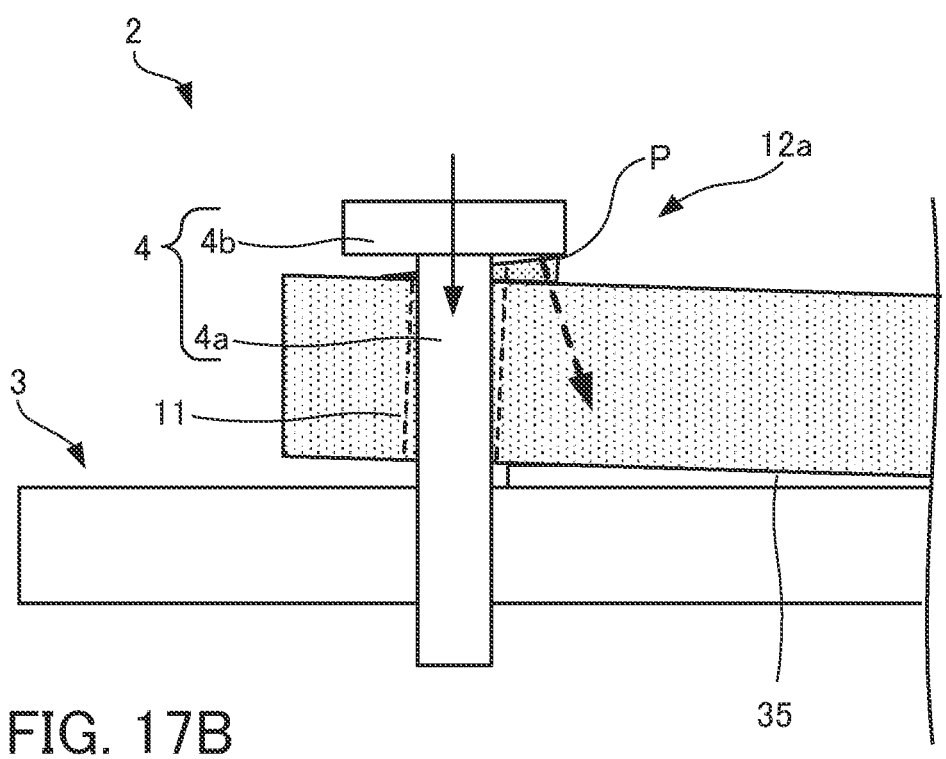

Next, attachment of the semiconductor module 2 to the cooling board 3 with the screws 4 will be described with reference to FIGS. 16A to 16C and FIGS. 17A and 17B. FIGS. 16A to 16C and FIGS. 17A and 17B each illustrate attachment of the semiconductor module according to the second embodiment to the cooling board. FIGS. 16A to 16C illustrate attachment of the semiconductor module 2 to the cooling board 3 in chronological order. FIGS. 17A and 17B are each an enlarged side view of the periphery of a screw 4. FIG. 17A illustrates when a screw 4 is inserted into an attachment hole 11, and FIG. 17B illustrates when the screw 4 is engaged with a fixing hole 3a. Before this attachment is performed as follows, the semiconductor module 2, the cooling board 3, and the screws 4 as described above are prepared in advance.

First, the semiconductor module 2 is disposed on the front surface of the cooling board 3. In this step, the attachment holes 11 in the semiconductor module 2 are positioned with respect to the fixing holes 3a in the cooling board 3. The heat dissipation plate 35 of the semiconductor module 2 is disposed on the front surface of the cooling board 3. When these components are disposed, the front surface 10e of the semiconductor module 2 is substantially horizontal to the front surface of the cooling board 3.

Next, the semiconductor module 2 is attached to the cooling board 3 with the screws 4. A screw 4 is inserted into one of the attachment hole 11 (the left attachment hole 11 in FIG. 16A) in the semiconductor module 2 toward the cooling board 3. The screw 4 inserted into the attachment hole 11 in the semiconductor module 2 is rotated clockwise and pressed against the cooling board 3 until the head portion 4b of the screw 4 abuts against the corresponding front surface supporting portion 12a (see FIG. 16A).

Next, the screws 4, the front surface supporting portions 12a, and the heat dissipation plate 35 will be described in detail. The head portion 4b of the individual screw 4 has a diameter R (the length from the shaft portion 4a to an outer periphery portion of the head portion 4b). This diameter R is between 3.0 mm and 3.5 mm, inclusive, for example, approximately 3.25 mm. In addition, as illustrated in FIG. 17A, the location of a line extending vertically from an end portion of the heat dissipation plate 35, the end portion being near the attachment hole 11, to the cooling board 3 will be referred to as E1, the location of a line extending vertically from an inner end portion of the front surface supporting portion 12a to the cooling board 3 will be referred to as E2, and the location of a line extending vertically from the outer periphery portion of the head portion 4b to the cooling board 3 will be referred to as E3. The location E1 corresponding to the end portion of the heat dissipation plate 35 is located closer to the shaft portion 4a than the location E3 corresponding to the head portion 4b.

The highest point of the individual front surface supporting portion 12a is the point P. In this case, the distance between the location E1 and the location E3 is W2 (<diameter R). The distance between the location E1 and the location E2 is W1 (<diameter R). In addition, as will be described below, it is preferable that the point P be located between the location E3 and the location E1. The distance W1 is between 4.0 mm and 4.5 mm, inclusive, for example, approximately 4.25 mm. The distance W2 is between 2.5 mm and 3.0 mm, inclusive, for example, approximately 2.75 mm.

From a state in which the head portion 4b of a screw 4 is into contact with the corresponding front surface supporting portion 12a, the screw 4 is rotated and pressed against the cooling board 3. As a result, as illustrated in FIG. 16B, an end portion (a corner portion) of the heat dissipation plate 35 serves as a fulcrum on the front surface of the cooling board 3, and the attachment hole 11 in the semiconductor module 2 is pressed against the cooling board 3 by the head portion 4b of the screw 4. An area near the other attachment hole 11 in the semiconductor module 2 is consequently lifted from the cooling board 3.

In this state, if the screw 4 is further rotated and pressed against the cooling board 3, as illustrated in FIG. 17B, the rear surface of the head portion 4b (head portion rear surface) presses the point P of the front surface supporting portion 12a in the direction indicated by a dashed arrow. Since the semiconductor module 2 receives this pressing force, the semiconductor module 2 is warped convexly downward, and the rear surface of the head portion 4b of the screw 4 abuts against the sloping surface of the front surface supporting portion 12a. By inserting the screw 4 into the other attachment hole 11 in the semiconductor module 2, the other side of the semiconductor module 2 is fixed to the cooling board 3 in the same way. As a result, the semiconductor device 1 illustrated in FIG. 16C is obtained. While the semiconductor module 2 is warped convexly downward, the semiconductor module 2 is not warped to such an extent that causes damage to the semiconductor module 2. According to the second embodiment, the semiconductor module 2 is attached to the cooling board 3 with the screws 4 without causing damage to the semiconductor module 2.

The semiconductor device 1 includes the semiconductor module 2, the screws 4, and the cooling board 3. The semiconductor module 2 includes the semiconductor chips 41a to 41d and the sealed main body portion 10 including the semiconductor chips 41a to 41d sealed with sealing material, having a cuboid shape, having the rear surface 10f from which the main surface of the heat dissipation plate 35 protrudes, and having the pair of attachment holes 11 penetrating therethrough from the front surface 10e to the rear surface 10f. The heat dissipation plate 35 is positioned between the attachment holes 11 in plan view. The cooling board 3 has a flat-plate shape, and the heat dissipation plate 35 of the semiconductor module 2 is disposed on the cooling board 3. The screws 4 are inserted into the pair of attachment holes 11 and are engaged with the fixing holes 3a in the cooling board 3. In this way, the cooling board 3 is attached to the semiconductor module 2. The semiconductor module 2 includes the front surface supporting portions 12a, each of which protrudes from the front surface 10e and is formed substantially between the pair of attachment holes 11 in plan view. When the semiconductor module 2 is attached to the cooling board 3 with the screws 4, the presence of the front surface supporting portions 12a somewhat warps the semiconductor module 2 convexly downward and prevents an area around the other attachment hole 11 from being lifted. The other screw 4 is inserted into the other attachment hole 11 and is engaged with the other fixing hole 3a in the cooling board 3 without causing damage to the semiconductor module 2. Thus, the present embodiment prevents deterioration of the reliability of the semiconductor module 2 and the semiconductor device 1 including the semiconductor module 2.

To attach the semiconductor module 2 to the cooling board 3 with the screws 4 such that the semiconductor module 2 is somewhat warped convexly downward, first, as illustrated in FIGS. 17A and 17B, the individual corner portion (end portion) (location E1) of the heat dissipation plate 35 needs to be prevented from serving as a fulcrum. Thus, the point P of the individual front surface supporting portion 12a needs to be located outside the corresponding location E1. That is, the sloping surface of the front surface supporting portion 12a needs to come into contact with the rear surface of the head portion 4b. By setting the sloping surface of the front surface supporting portion 12a between the location E1 and the location E3, the rear surface of the head portion 4b presses the point P in the direction indicated by the dashed arrow in FIG. 17B. In this way, the semiconductor module 2 is warped convexly downward and fixed to the cooling board 3 with the screws 4 more reliably.

Alternatively, the individual front surface supporting portion 12a may simply be formed to include a protrusion, instead of having the above sloping surface. In this case, the protruding front surface supporting portion 12a is located between the location E1 and the location E3, and the rear surface of the head portion 4b presses the semiconductor module 2 in the same direction as described above. In this case, it is preferable that the individual front surface supporting portion 12a be located as close as possible to the location E3 between the location E1 and the location E3.

According to the disclosed technique, since a semiconductor module is attached to a cooling board without causing damage to the semiconductor module, deterioration of the reliability is prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module, comprising:
a semiconductor chip;
a sealed main body portion sealing the semiconductor chip with a sealing material, the sealed main body portion being of a cuboid shape, and having a pair of attachment holes penetrating therethrough from a front surface thereof to a rear surface thereof;
a heat dissipation plate, a main surface of which is in contact with the rear surface of the sealed main body portion, the heat dissipation plate being positioned under the semiconductor chip sealed by the sealed main body portion and between the pair of attachment holes in a plan view of the semiconductor module; and
a pair of rear surface supporting portions protruding from the rear surface of the sealed main body portion, and corresponding respectively to the pair of attachment holes, both the heat dissipation plate and the pair of attachment holes being positioned, each in an entirety thereof, between respective parts of the pair of rear surface supporting portions in the plan view of the semiconductor module, the respective parts both facing toward the semiconductor chip in the plan view, or
a pair of front surface supporting portions protruding from the front surface of the sealed main body portion, and corresponding respectively to the pair of attachment holes, each of the front surface supporting portions, except for an outermost portion thereof, being formed between the pair of attachment holes in the plan view of the semiconductor module.

2. The semiconductor module according to claim 1, wherein
the sealed main body portion has two short sides located opposite to each other in the plan view thereof, a center line of the sealed main body portion passing through a center of each of the two short sides; and the pair of attachment holes are both formed on the center line.

3. The semiconductor module according to claim 2, wherein
the pair of rear surface supporting portions correspond respectively to the opposite short sides, and are in parallel to the opposite short sides, and
each of the rear surface supporting portions has a length that corresponds to a width of a corresponding one of the pair of attachment holes.

4. The semiconductor module according to claim 3, wherein each of the rear surface supporting portions is formed along a corresponding one of the opposite short sides.

5. The semiconductor module according to claim 4, wherein said each rear surface supporting portion includes a plurality of sections, each section along said corresponding one of the opposite short sides.

6. The semiconductor module according to claim 4, wherein said each rear surface supporting portion is formed continuously along an entire side of said corresponding one of the opposite short sides.

7. The semiconductor module according to claim 3, wherein in a direction in which a long side of the sealed main body portion extends, a width of each of the rear surface supporting portions corresponds to a distance between one of the pair of attachment holes corresponding to said each rear surface supporting portion and one of the opposite short sides corresponding to said each rear surface supporting portion.

8. The semiconductor module according to claim 2, wherein, in a case where the front surface supporting portions are formed, the sealed main body portion is warped convexly, in a direction toward the heat dissipation plate, in a side view of the semiconductor module.

9. The semiconductor module according to claim 8, further comprising:
a pair of screws inserted respectively into the pair of attachment holes; and
a cooling board having a flat plate shape, the cooling board being attached to the sealed main body portion, being in contact with the heat dissipation plate, and being configured to engage with the screws inserted into the pair of attachment holes.

10. The semiconductor module according to claim 9, wherein each of the screws has
a cylindrical shaft portion for insertion into a corresponding one of the pair of attachment holes, and
a head portion having a diameter larger than a diameter of the shaft portion, for pressing, when the shaft portion engages with the cooling board, the corresponding attachment hole toward the cooling board,
said each screw being so configured that, when inserted in the corresponding attachment hole, an end portion of the heat dissipation plate in the side view is located closer to the shaft portion than to an outer periphery portion of the head portion.

11. The semiconductor module according to claim 10, wherein in the side view, a portion of a rear surface of the head portion of said each screw, when inserted in the corresponding attachment hole, is supported by one of the front surface supporting portions, the portion being between a location on a line vertically extending from the end portion of the heat dissipation board and the outer periphery portion of the head portion.

12. The semiconductor module according to claim 11, wherein in the side view, said one front surface supporting portion has a sloping surface, one side of the sloping surface that is farther from the shaft portion of said each screw has a larger height than the other side of the sloping surface opposite to said one side.

13. The semiconductor module according to claim 12, wherein in the side view, a highest point of the sloping surface is located in said portion of the rear surface of the head portion of said each screw inserted in the corresponding attachment hole.

14. The semiconductor module according to claim 1, wherein each of the rear surface supporting portions has a height equal to a distance between the rear surface of the sealed main body portion and the main surface of the heat dissipation plate.

15. The semiconductor module according to claim 1, wherein each of the rear surface supporting portions has an outside corner portion that faces an outside of the sealed main body portion in the plan view and that is rounded.

16. The semiconductor module according to claim 1, wherein the rear surface supporting portions, the front surface supporting portions, and the sealing material are made of a same material.

17. The semiconductor module according to claim 1, wherein the pair of rear surface supporting portions are free of overlapping the heat dissipation plate in a direction perpendicular to the main surface of the heat dissipation plate.

* * * * *